(12) United States Patent
Ishii et al.

(10) Patent No.: US 8,247,700 B2
(45) Date of Patent: *Aug. 21, 2012

(54) WIRED CIRCUIT BOARD

(75) Inventors: Jun Ishii, Osaka (JP); Yasunari Ooyabu, Osaka (JP); Visit Thaveeprungsriporn, Osaka (JP)

(73) Assignee: Nitto Denko Corporation, Osaka (JP)

( * ) Notice: Subject to any disclaimer, the term of this patent is extended or adjusted under 35 U.S.C. 154(b) by 271 days.

This patent is subject to a terminal disclaimer.

(21) Appl. No.: 12/382,266

(22) Filed: Mar. 12, 2009

(65) Prior Publication Data

US 2009/0183907 A1    Jul. 23, 2009

Related U.S. Application Data

(63) Continuation of application No. 11/812,797, filed on Jun. 21, 2007, now Pat. No. 7,737,365.

(60) Provisional application No. 60/847,096, filed on Sep. 26, 2006.

(30) Foreign Application Priority Data

Jun. 22, 2006   (JP) .................................. 2006-172744

(51) Int. Cl.
   *H05K 1/00*   (2006.01)
(52) U.S. Cl. ........ 174/254; 174/250; 174/255; 174/256; 174/257; 174/258; 174/259; 174/260; 174/261; 174/262; 361/313; 361/748; 428/34.9; 428/36.91; 428/328; 428/329; 257/29; 257/59; 257/288; 257/702; 257/777; 360/234.5; 360/244.1; 360/245; 360/245.8; 360/264.2

(58) Field of Classification Search .................. 174/254, 174/250, 255–262; 361/748, 313; 428/34.9, 428/36.91, 328, 329; 257/29, 59, 288, 702, 257/777; 360/234.5, 244.1, 245, 245.8, 245.9, 360/264.2
See application file for complete search history.

(56) References Cited

U.S. PATENT DOCUMENTS

| | | |
|---|---|---|
| 3,935,333 A | 1/1976 | Muneoka et al. |
| 4,109,098 A | 8/1978 | Olsson et al. |
| 4,289,920 A | 9/1981 | Hovel |
| 4,719,436 A | 1/1988 | Garwin et al. |

(Continued)

FOREIGN PATENT DOCUMENTS

JP   2003-152383   5/2003

(Continued)

OTHER PUBLICATIONS

US 6,693,084, Nov. 2005, Arao et al. (withdrawn).

*Primary Examiner* — Xiaoliang Chen
(74) *Attorney, Agent, or Firm* — Jean C. Edwards, Esq.; Edwards Neils PLLC

(57) ABSTRACT

A wired circuit board has a metal supporting board, an insulating layer formed on the metal supporting board, a conductive pattern formed on the insulating layer and having a pair of wires arranged in spaced-apart relation, and a semiconductive layer formed on the insulating layer and electrically connected to the metal supporting board and the conductive pattern. The conductive pattern has a first region in which a distance between the pair of wires is small and a second region in which the distance between the pair of wires is larger than that in the first region. The semiconductive layer is provided in the second region.

2 Claims, 10 Drawing Sheets

U.S. PATENT DOCUMENTS

| | | | |
|---|---|---|---|
| 4,823,217 | A | 4/1989 | Kato et al. |
| 4,879,620 | A | 11/1989 | Yamashita |
| 4,901,121 | A | 2/1990 | Gibson |
| 5,039,598 | A | 8/1991 | Abramsohn et al. |
| 5,087,517 | A | 2/1992 | Sagawa et al. |
| 5,340,641 | A | 8/1994 | Xu |
| 5,414,576 | A | 5/1995 | Ueki et al. |
| 5,558,977 | A | 9/1996 | DePalma et al. |
| 5,615,078 | A | 3/1997 | Hudis et al. |
| 5,675,470 | A | 10/1997 | Gong |
| 5,686,521 | A | 11/1997 | Massengale et al. |
| 5,742,075 | A | 4/1998 | Burns et al. |
| 5,781,380 | A | 7/1998 | Berding et al. |
| 5,812,349 | A | 9/1998 | Shouji et al. |
| 5,857,257 | A * | 1/1999 | Inaba ................. 29/603.04 |
| 5,883,759 | A | 3/1999 | Schulz |
| 5,883,767 | A * | 3/1999 | Coffey et al. ............ 360/128 |
| 6,011,271 | A * | 1/2000 | Sakuma et al. ............ 257/14 |
| 6,134,084 | A | 10/2000 | Ohwe et al. |
| 6,172,903 | B1 * | 1/2001 | Nishimura ............... 365/158 |
| 6,198,052 | B1 | 3/2001 | Omote et al. |
| 6,298,212 | B1 | 10/2001 | Kono et al. |
| 6,315,501 | B1 | 11/2001 | Yagai et al. |
| 6,316,734 | B1 * | 11/2001 | Yang ......................... 174/256 |
| 6,326,553 | B1 | 12/2001 | Yim et al. |
| 6,341,415 | B2 | 1/2002 | Amemiya et al. |
| 6,351,351 | B1 * | 2/2002 | Takasugi ................. 360/245.9 |
| 6,380,493 | B1 * | 4/2002 | Morita et al. ............. 174/258 |
| 6,388,201 | B2 * | 5/2002 | Yamato et al. ............ 174/255 |
| 6,399,899 | B1 * | 6/2002 | Ohkawa et al. ........... 174/261 |
| 6,479,615 | B2 * | 11/2002 | Fukuoka et al. .......... 528/170 |
| 6,483,123 | B1 | 11/2002 | Kim et al. |
| 6,506,087 | B1 | 1/2003 | Fushimi et al. |
| 6,624,046 | B1 | 9/2003 | Zavracky et al. |
| 6,649,934 | B2 * | 11/2003 | Song et al. .................. 257/59 |
| 6,650,519 | B1 | 11/2003 | Karr et al. |
| 6,657,688 | B2 | 12/2003 | Nagata et al. |
| 6,693,735 | B1 | 2/2004 | Muray et al. |
| 6,771,737 | B2 | 8/2004 | Kerslick et al. |
| 6,784,471 | B2 | 8/2004 | Nakabayashi |
| 6,791,742 | B2 | 9/2004 | Staker et al. |
| 6,801,402 | B1 * | 10/2004 | Subrahmanyam et al. 360/245.9 |
| 6,841,737 | B2 * | 1/2005 | Komatsubara et al. ....... 174/250 |
| 6,943,302 | B2 | 9/2005 | Kageyama et al. |
| 6,995,954 | B1 | 2/2006 | Coon |
| 7,084,493 | B2 * | 8/2006 | Funada et al. ............. 257/702 |
| 7,115,673 | B2 | 10/2006 | Mochizuki et al. |
| 7,247,529 | B2 | 7/2007 | Shoji et al. |
| 7,329,817 | B2 | 2/2008 | Aonuma et al. |
| 7,336,446 | B2 * | 2/2008 | Kanagawa et al. ........ 360/245.9 |
| 7,371,625 | B2 | 5/2008 | Yamazaki et al. |
| 7,372,669 | B2 * | 5/2008 | Deguchi et al. ............ 360/245.9 |
| 2001/0005298 | A1 | 6/2001 | Hiraoka |
| 2001/0028536 | A1 | 10/2001 | Sugimoto et al. |
| 2003/0089520 | A1 | 5/2003 | Ooyabu et al. |
| 2004/0058148 | A1 | 3/2004 | Ito et al. |
| 2004/0198028 | A1 * | 10/2004 | Tanaka et al. ............. 438/487 |
| 2004/0221447 | A1 | 11/2004 | Ishii et al. |
| 2004/0246626 | A1 * | 12/2004 | Wakaki et al. ............ 360/245.8 |
| 2004/0258863 | A1 * | 12/2004 | Kobayashi et al. .......... 428/34.9 |
| 2004/0259326 | A1 | 12/2004 | Hideo |
| 2005/0053720 | A1 * | 3/2005 | Yamazaki et al. .............. 427/69 |
| 2005/0058445 | A1 | 3/2005 | Kaneiwa et al. |
| 2005/0117257 | A1 | 6/2005 | Thaveeprungsriporn et al. |
| 2005/0158665 | A1 | 7/2005 | Maekawa et al. |
| 2005/0186332 | A1 * | 8/2005 | Funada et al. .............. 427/96.1 |
| 2005/0248885 | A1 * | 11/2005 | Funada et al. ............. 360/245.9 |
| 2006/0040435 | A1 | 2/2006 | Morisue et al. |
| 2006/0087011 | A1 * | 4/2006 | Kanagawa et al. ........... 257/676 |
| 2006/0139809 | A1 | 6/2006 | Matsumoto et al. |
| 2006/0159898 | A1 | 7/2006 | Uchiyama et al. |
| 2006/0187587 | A1 | 8/2006 | Arai et al. |
| 2006/0190673 | A1 * | 8/2006 | Arai et al. ................... 711/101 |
| 2006/0193084 | A1 | 8/2006 | Satoh et al. |
| 2006/0202357 | A1 * | 9/2006 | Kanagawa et al. ........... 257/784 |
| 2006/0209462 | A1 | 9/2006 | Kajitani et al. |
| 2006/0238921 | A1 | 10/2006 | Matsumoto et al. |
| 2006/0244063 | A1 | 11/2006 | Isobe et al. |
| 2006/0269730 | A1 * | 11/2006 | Ishii et al. ................... 428/209 |
| 2007/0019331 | A1 | 1/2007 | Kido et al. |
| 2007/0269021 | A1 | 11/2007 | Yamaguchi et al. |
| 2007/0279805 | A1 | 12/2007 | Komura et al. |
| 2007/0279807 | A1 | 12/2007 | Kobayashi et al. |
| 2008/0000673 | A1 * | 1/2008 | Ishii et al. ................... 174/250 |
| 2008/0038517 | A1 | 2/2008 | Nishihata et al. |

FOREIGN PATENT DOCUMENTS

| | | |
|---|---|---|
| JP | 2004-035825 | 2/2004 |
| JP | 2004-335700 | 11/2004 |
| JP | 2006-120863 | 5/2005 |
| JP | 2006-93228 | 4/2006 |
| JP | 2006-134421 | 5/2006 |

* cited by examiner

FIG. 3
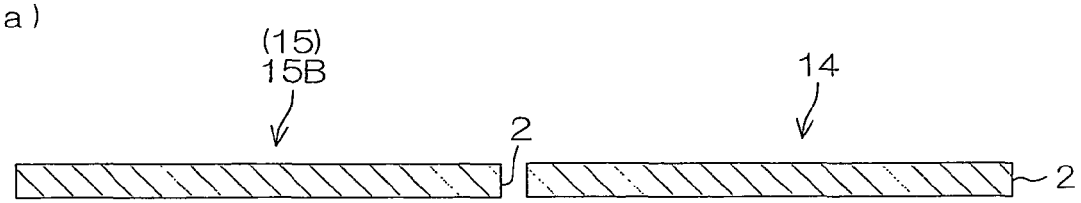
(a)
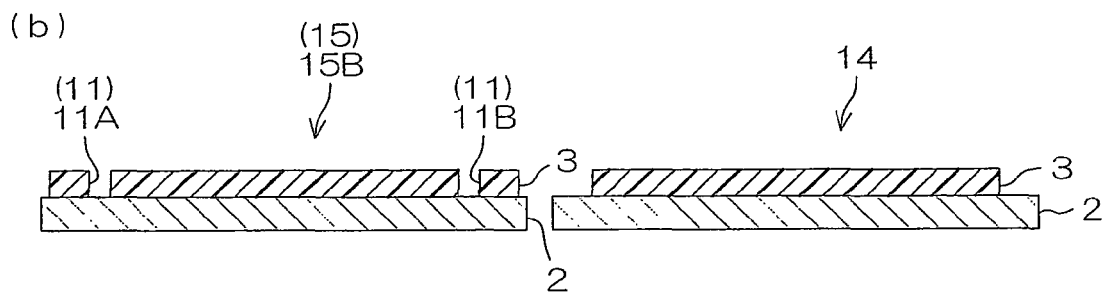
(b)
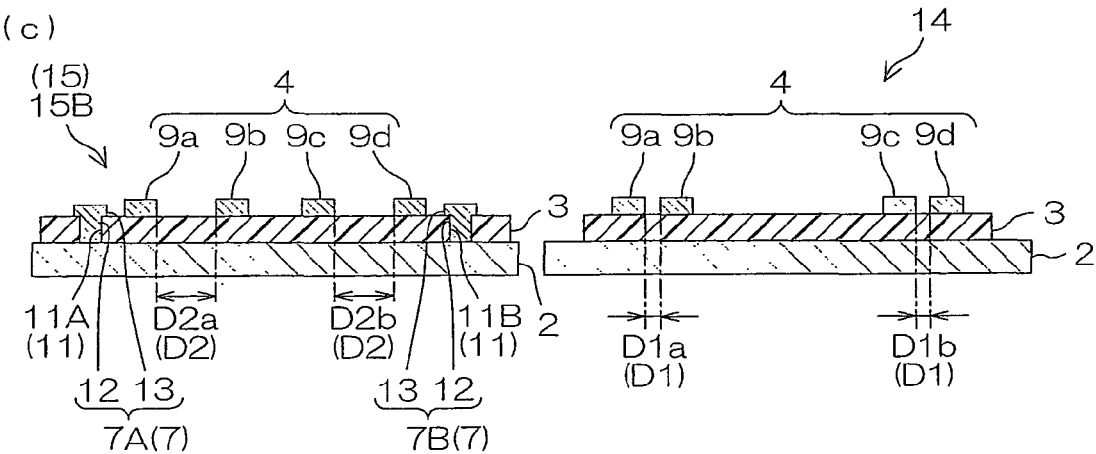
(c)
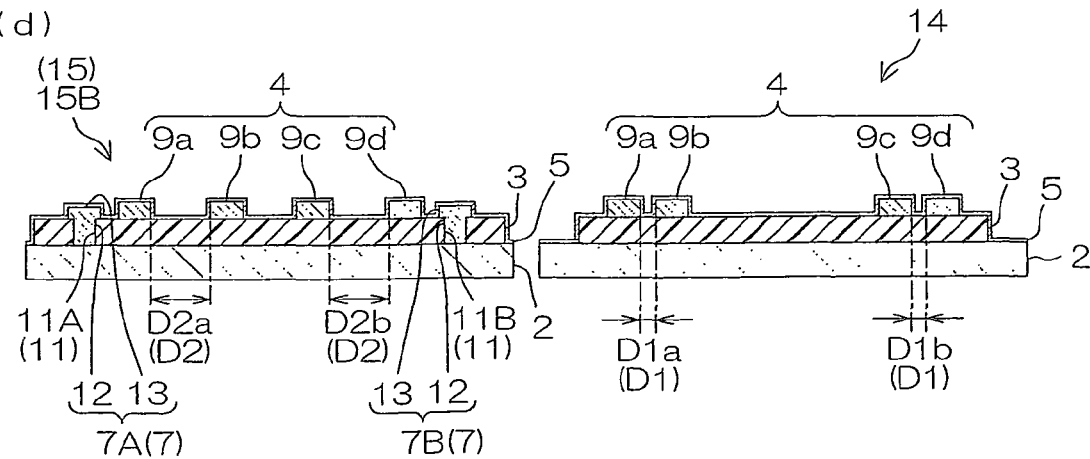
(d)

FIG. 4
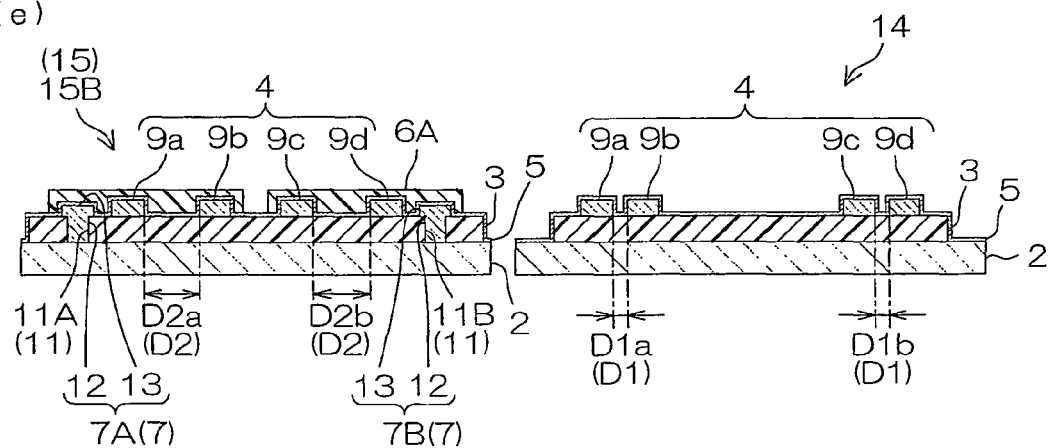
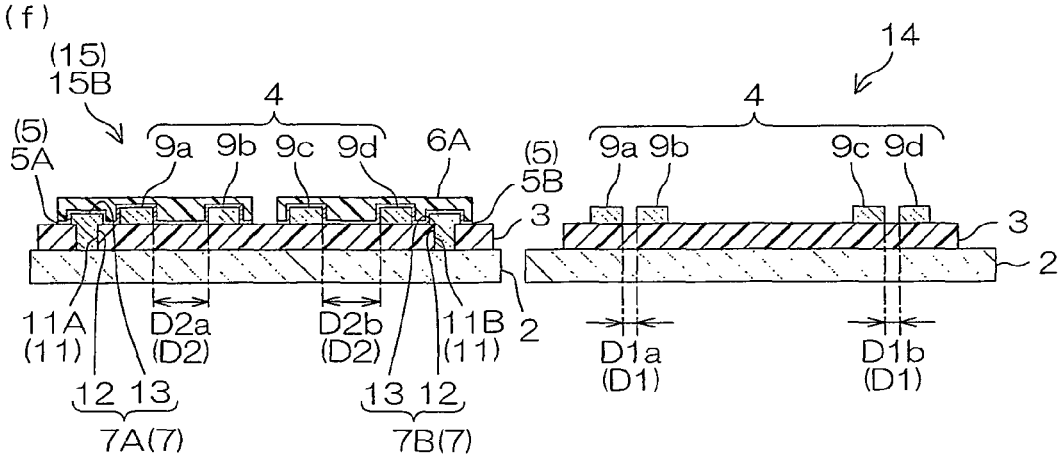
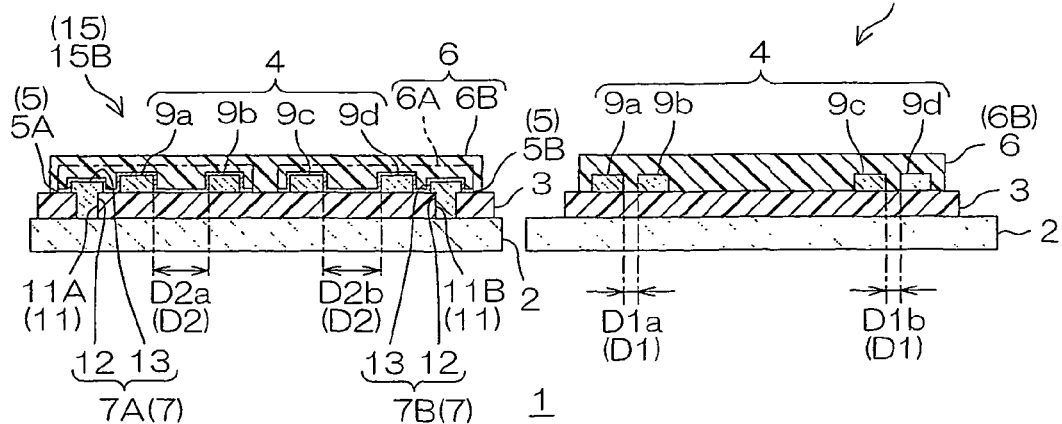

WIRED CIRCUIT BOARD

CROSS-REFERENCE TO RELATED APPLICATION

This application is a Continuation Application of U.S. patent application Ser. No. 11/812,797, filed Jun. 21, 2007 now U.S. Pat. No. 7,737,365, which claims the benefit of U.S. Provisional Application No. 60/847,096 filed on Sep. 26, 2006 and claims priority from Japanese Patent Application No. 2006-172744 filed on Jun. 22, 2006, the contents of which are herein incorporated by reference in their entirety.

FIELD OF THE INVENTION

The present invention relates to a wired circuit board and, more particularly, to a wired circuit board such as a suspension board with circuit on which an electronic component is mounted.

DESCRIPTION OF THE RELATED ART

A wired circuit board such as a suspension board with circuit comprises, e.g., a metal supporting board made of a stainless steel foil or the like, an insulating base layer made of a polyimide resin or the like and formed on the metal supporting board, a conductive pattern made of a copper foil or the like and formed on the insulating base layer, and an insulating cover layer made of a polyimide resin or the like and formed on the insulating base layer to cover the conductive pattern. Such a wire circuit board is widely used in the field of various electric and electronic equipment.

To prevent electrostatic breakdown of an electronic component mounted on such a wire circuit board, it has been proposed to form a semiconductive layer by successively laminating a metal thin film and a metal oxide layer on the surfaces of the insulating cover layer and the insulating base layer of a suspension board with circuit to remove the electrostatic charging by means of the semiconductive layer (see, e.g., Japanese Unexamined Patent Publication No. 2004-335700).

It has also been proposed to form a semiconductive layer on the surface of an insulating layer, form through holes extending through the insulating layer and the semiconductive layer to expose a conductive layer, form connection terminals in the through holes to bring the semiconductive layer into contact with the connection terminals to remove the electrostatic charging of the insulating layer and the conductive layer (see, e.g., Japanese Unexamined Patent Publication No. 2003-152383).

SUMMARY OF THE INVENTION

However, in Japanese Unexamined Patent Publication No. 2004-335700, the semiconductive layer formed only on the surfaces of the insulating cover layer and the insulating base layer is insufficient to remove the electrostatic charging of the conductive layer, resulting in that the electrostatic breakdown of a mounted electronic component can not be prevented reliably.

In Japanese Unexamined Patent Publication No. 2003-152383, the semiconductive layer is in contact with the connection terminals, not with the conductive layer. When the connection terminals are not formed, the electrostatic charging of the conductive layer cannot be removed.

Therefore, it is proposed that in a suspension board with circuit 31, e.g., a semiconductive layer 35 is continuously formed between an insulating cover layer 36 and the respective surfaces of a conductive pattern. 34, an insulating base layer 33, and a metal supporting board 32 at the same position as the insulating cover layer 36 when viewed in plan view, as shown by the hatched portions of FIG. 12 and FIG. 13 to remove the electrostatic charging of the conductive pattern 34 by means of the semiconductive layer 35.

However, in the suspension board with circuit 31 in which such a semiconductive layer 35 is formed, there may be a case where a conductive material forming the conductive pattern 34 migrates (ion migration) between a pair of wires 37 (between a pair of wires 37a and 37b or between a pair of wires 37c and 37d) along the semiconductive layer 35, resulting in a short circuit between the pair of wires 37.

In the conductive pattern 34, the pair of wires 37a and 37b are usually formed to have a smaller distance therebetween in a middle region R1 between the front end portion and the rear end portion of the suspension board with circuit 31 and have a larger distance therebetween in a both end region R2 at the front end portion and the rear end portion. Therefore, when the insulating cover layer 36 is formed to include the first region R1 and the second region R2 and the semiconductive layer 35 is formed at the same position as the insulating cover layer 36, a problem arises that the conductive pattern 34 is short-circuited at an early stage since the distance between the pair of wires 37a and 37b covered with the semiconductive layer 35 is smaller in the first region R1 than that in the second region R2.

It is therefore an object of the present invention to provide a wired circuit board which allows efficient removal of the electrostatic charging of a conductive pattern and prevention of an early short circuit thereof.

A wired circuit board according to the present invention comprises a metal supporting board, an insulating layer formed on the metal supporting board, a conductive pattern formed on the insulating layer and having a pair of wires arranged in spaced-apart relation, and a semiconductive layer formed on the insulating layer and electrically connected to the metal supporting board and the conductive pattern, wherein the conductive pattern has a first region in which a distance between the pair of wires is small and a second region in which the distance between the pair of wires is larger than that in the first region and the semiconductive layer is provided in the second region.

In the wired circuit board according to the present invention, it is preferable that the distance between the pair of wires in the second region is not less than 20 μm.

In the wired circuit board according to the present invention, it is preferable that at least the pair of wires are arranged in an opposing relation and have different potentials, the semiconductive layer is electrically connected to the metal supporting board on one side outside a region where the pair of wires are opposed, an insulating cover layer is formed on the semiconductive layer.

In the wired circuit board according to the present invention, it is preferable that the semiconductive layer is in contact with the metal supporting board on the one side outside the region where the pair of wires are opposed.

In the wired circuit board according to the present invention, it is preferable that an opening is formed in the insulating layer on the one side outside the region where the pair of wires are opposed to extend through the insulating layer in a thickness direction and a ground connection portion in contact with the metal supporting board and the semiconductive layer is provided on the metal supporting board exposed from the opening.

The wired circuit board according to the present invention has the semiconductive layer electrically connected to the metal supporting board and the conductive pattern. Consequently, the conductive pattern is electrically connected to the metal supporting board via the semiconductive layer. This allows efficient removal the electrostatic charging of the conductive pattern. In addition, in the wired circuit board according to the present invention, the semiconductive layer is provided in the second region of the conductive pattern in which the distance between the pair of wires is large. Therefore, even when a conductive material forming the conductive pattern migrates between the pair of wires along the semiconductive layer, the short circuit of the conductive pattern is delayed since the distance between the pair of wires is larger than that in the first region. Thus, an early short circuit of the conductive pattern can be prevented.

As a result, it is possible to reliably prevent the electrostatic breakdown of an electronic component mounted and also improve the connection reliability of the wired circuit board over a long period.

A wired circuit board according to the present invention comprises a metal supporting board, an insulating layer formed on the metal supporting board, a conductive pattern formed on the insulating layer and having a pair of wires arranged in spaced-apart relation, a semiconductive layer formed on the insulating layer and electrically connected to the metal supporting board and the conductive pattern, wherein the semiconductive layer is formed to ensure a length of not less than 20 μm between the pair of wires.

In the wired circuit board according to the present invention, the semiconductive layer is formed to have a length of not less than 20 μm between the pair of wires. Therefore, even when a conductive material forming the conductive pattern migrates along the semiconductive layer, the short circuit of the conductive pattern is delayed and an early short circuit of the conductive pattern can be effectively prevented.

As a result, it is possible to reliably prevent the electrostatic breakdown of an electronic component mounted and also improve the connection reliability of the wired circuit board over a long period.

BRIEF DESCRIPTION OF THE DRAWINGS

FIG. 3 is a cross-sectional view showing the steps of producing the suspension board with circuit shown in FIG. 2, including a left-side view corresponding to the cross-sectional view of the rear end region along the line A-A of FIG. 1 and a right-side view corresponding to the cross-sectional view of the middle region along the line B-B of FIG. 1, (a) showing the step of preparing a metal supporting board, (b) showing the step of forming an insulating base layer on the metal supporting board such that a base opening is formed, (c) showing the step of simultaneously forming a conductive pattern and the ground connection portion, and (d) showing the step of continuously forming a semiconductive layer on the entire surfaces of the conductive pattern, the ground connection portion, the insulating base layer, and the metal supporting board;

FIG. 4 is a cross-sectional view showing the steps of producing the suspension board with circuit shown in FIG. 2 subsequently to FIG. 3, including a left-side view corresponding to the cross-sectional view of the rear end region along the line A-A of FIG. 1 and a right-side view corresponding to the cross-sectional view of the middle region along the line B-B of FIG. 1, (e) showing the step of forming a first insulating cover layer in a pattern on the semiconductive layer in the rear end region, (f) showing the step of removing the semiconductive layer exposed from the first insulating cover layer, and (g) showing the step of forming a second insulating cover layer in a pattern on the first insulating cover layer and the insulating base layer;

DETAILED DESCRIPTION OF THE INVENTION

Figure 1:
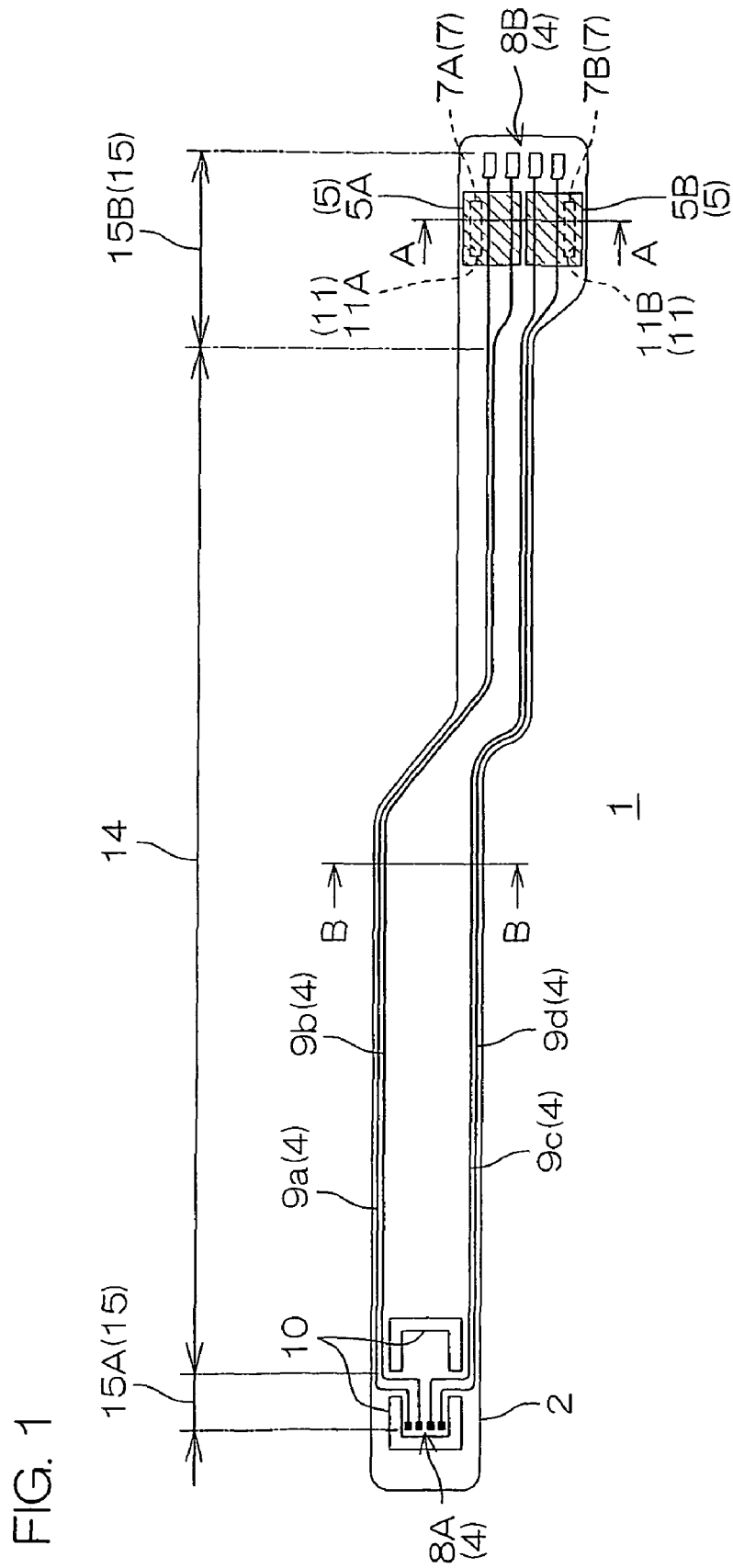
FIG. 1 is a schematic plan view showing a suspension board with circuit as a wired circuit board according to an embodiment (in which a semiconductive layer is electrically connected to a metal supporting board via a ground connection portion) of the present invention.
Figure 2:
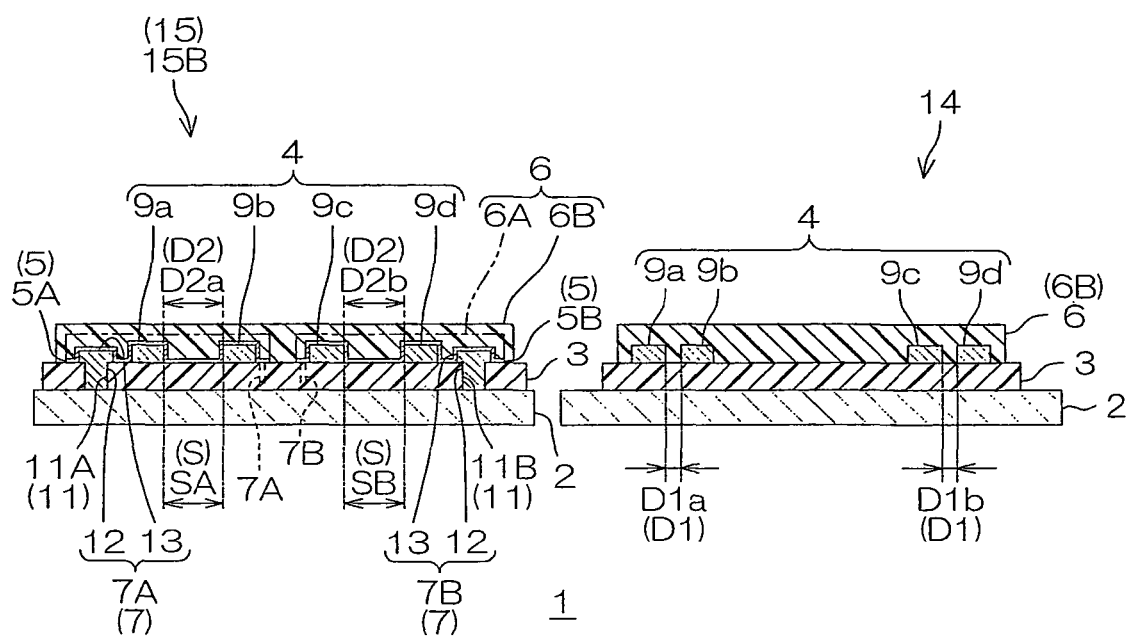
FIG. 2 is a cross-sectional view in a widthwise direction of the suspension board with circuit shown in FIG. 1, including a left-side view as a cross-sectional view of a rear end region along the line A-A of FIG. 1 and a right-side view as a cross-sectional view of a middle region along the line B-B of FIG. 1.

FIG. 1 is a schematic plan view showing a suspension board with circuit as a wired circuit board according to an embodiment of the present invention. FIG. 2 is a cross-sectional view in a direction orthogonal to a longitudinal direction (hereinafter referred to as a widthwise direction) of the suspension board with circuit shown in FIG. 1. FIG. 2 includes a left-side view as a cross-sectional view of a rear end region, described later, along the line A-A of FIG. 1 and a right-side view as a cross-sectional view of a middle region, described later, along the line B-B of FIG. 1. In FIG. 1, an insulating base layer 3 and an insulating cover layer 6, each described later, are partly omitted for clear illustration of a relative position of a conductive pattern 4 to a metal supporting board 2.

In FIG. 1, a suspension board with circuit 1 comprises the metal supporting board 2 mounted on a hard disk drive. The conductive pattern 4 connecting a magnetic head (not shown) and a read/write board is formed integrally on the metal supporting board 2. The metal supporting board 2 supports the magnetic head mounted thereon, while holding a minute gap between the magnetic head and a magnetic disk against an air flow caused when the magnetic head and the magnetic disk travel relatively to each other.

The conductive pattern 4 comprises magnetic-head-side connection terminal portions 8A, external connection terminal portions 8B, and a plurality of wires 9 for connecting the magnetic-head-side connection terminal portions 8A and the external connection terminal portions 8B integrally and continuously.

The plurality of wires 9 are provided in the longitudinal direction of the metal supporting board 2 and arranged in mutually spaced-apart and parallel opposed relation in the widthwise direction of the metal supporting board 2.

The plurality of wires 9 are composed of one pair of wires 9a and 9b arranged in mutually parallel opposed relation on one widthwise side and the other pair of wires 9c and 9d arranged in mutually parallel opposed relation on the other widthwise side. Of the one pair of wires 9a and 9b, the one wire 9a is disposed outside in the widthwise direction and the other wire 9b is disposed inside in the widthwise direction. Of the other pair of wires 9c and 9d, the one wire 9c is disposed inside in the widthwise direction and the other wire 9d is disposed outside in the widthwise direction.

To the one pair of wires 9a and 9b, a read signal and a write signal having different potentials are respectively inputted so that a potential difference is constantly produced therebetween. As well as to the other pair of wires 9c and 9d, a read signal and a write signal having different potentials are respectively inputted so that a potential difference is constantly produced therebetween.

More specifically, each of the wires 9 is either a read wire for reading data on the magnetic disk or a write wire for writing data on the magnetic disk. The combination of each wire in a pair is selected such that the one wire 9a is a read wire and the other wire 9b is a write wire or vice versa in one pair, and the one wire 9c is a read wire and the other wire 9d is a write wire or vice versa in the other pair.

The plurality of magnetic-head-side connection terminal portions 8A are provided as wide lands and arranged in parallel at the front end portion of the metal supporting board 2 and connected individually to the respective front end portions of the wires 9. To the magnetic-head-side connection terminal portions 8A, terminal portions (not shown) of the magnetic head are connected.

The plurality of external connection terminal portions 8B are provided as wide lands and arranged in parallel at the rear end portion of the metal supporting board 2 and connected individually to the respective rear end portions of the wires 9. To the external connection terminal portions 8B, terminal portions (not shown) of the read/write board are connected.

The front end portion of the metal supporting board 2 is provided with a gimbal 10 for mounting the magnetic head. The gimbal 10 is formed by cutting out the metal supporting board 2 to sandwich the magnetic-head-side connection terminal portions 8A in the longitudinal direction.

The conductive pattern 4 has a middle region 14 as a first region between the front end portion and the rear end portion of the suspension board with circuit 1 and has a both end region regions 15 as a second region comprising a front end region 15A and a rear end region 15B at the front end portion and the rear end portion of the suspension board with circuit 1.

As shown in FIGS. 1 and 2, a distance (spacing between the parallel wires 9 along the direction orthogonal to the longitudinal direction, hereinafter referred to as such) D1 between the wires 9 in the middle region 14 of the conductive pattern 4, more specifically, each of a distance D1a between the one pair of wires 9a and 9b, and a distance D1b between the other pair of wires 9c and 9d is formed to be smaller than a distance D2 in the two end regions 15 described below. More specifically, the distance D1 between the wires 9 is set to a value in the range of, e.g., 10 to 100 μm, preferably 15 to 50 μm, or more preferably 17 to 40 μm.

The distance D2 between the wires 9 in the two end regions 15 of the conductive pattern 4, more specifically, each of a distance D2a between the one pair of wires 9a and 9b, and a distance D2b between the other pair of wires 9c and 9d is formed to be larger than the distance D1 in the middle region 14 described above. More specifically, the distance D2 between the individual wires 9 is set to a value in the range of, e.g., not less than 20 μm, preferably not less than 30 μm, more preferably not less than 40 μm, or normally not more than 500 μm.

The width of each of the wires 9 (width of each of the wires 9 in a direction orthogonal to the longitudinal direction, hereinafter referred to as such) is in the range of, e.g., 10 to 100 μm, or preferably 15 to 50 μm.

The distance between the individual terminal portions 8 (the magnetic-head-side connection terminal portions 8A and the external connection terminal portions 8B) is in the range of, e.g., 20 to 1000 μm, or preferably 30 to 800 μm. The width of each of the terminal portions 8 (the magnetic-head-side connection terminal portions 8A and the external connection terminal portions 8B) is in the range of, e.g., 20 to 1000 μm, or preferably 30 to 800 μm.

As shown in the left-side view of FIG. 2, the suspension board with circuit 1 includes the metal supporting board 2, the insulating base layer 3 as an insulating layer formed on the metal supporting board 2, the conductive pattern 4 formed on the insulating base layer 3, a ground connection portion 7 formed on the metal supporting board 2, a semiconductive layer 5 formed on the insulating base layer 3 to cover the conductive pattern 4 and the ground connection portion 7, and the insulating cover layer 6 formed on the semiconductive layer 5.

The ground connection portion 7 and the semiconductive layer 5 are provided only in the rear end region 15B, as is described later.

The metal supporting board 2 is formed of a flat thin plate extending longitudinally in correspondence to the outer shape of the suspension board with circuit 1 described above.

The length (longitudinal length, hereinafter referred to as such) and width (widthwise length, hereinafter referred to as such) of the metal supporting board 2 are selected appropriately depending on the purpose and application.

The insulating base layer 3 is formed on the metal supporting board 2 to have a pattern which exposes the portion where the ground connection portion 7 is formed as well as the peripheral end portion of the metal supporting board 2 in correspondence to the portion where the conductive pattern 4 is formed.

To form a one side ground connection portion 7A as the ground connection portion 7, a one side base opening 11A as an opening is formed in the insulating base layer 3 on one widthwise side (left-hand side) of the rear end region 15B and extend therethrough in the thickness direction in widthwise outside and spaced-apart relation with the one widthwise outermost wire 9a of the conductive pattern 4. To form the other ground connection portion 7B as the ground connection portion 7, the other side base opening 11B as an opening is also formed in the insulating base layer 3 on the other widthwise side (right-hand side) of the rear end region 15B and extend therethrough in the thickness direction in widthwise outside and spaced-apart relation with the other widthwise outermost wire 9d of the conductive pattern 4.

Each of the one side ground connection portion 7A and the other side ground connection portion 7B is hereinafter simply described as the ground connection portion 7 when distinction therebetween is not particularly needed. Each of the one side base opening 11A and the other side base opening 11B is simply described as the base opening 11 when distinction therebetween is not particularly needed.

As indicated by the broken lines in FIG. 1, the base opening 11 is formed in a generally rectangular shape extending in the longitudinal direction when viewed in plan view.

The length and width of the insulating base layer 3 are selected appropriately depending on the purpose and application to define the shape described above.

The conductive pattern 4 is formed as a wired circuit pattern integrally including the plurality of wires 9 (the wires 9a, 9b, 9c, and 9d) arranged on the insulating base layer 3 in mutually spaced-apart and parallel opposed relation as described above, the magnetic-head-side connection terminal portions 8A connected to the respective front end portions of the wires 9, and the external connection terminal portions 8B connected to the respective rear end portions of the wires 9. Each of the magnetic-head-side connection terminal portions 8A and the external connection terminal portions 8B is hereinafter simply described as a terminal portion 8 when distinction therebetween is not particularly needed.

The conductive pattern 4 also has the middle region 14 in which the distance D1 between the pair of wires 9 is smaller and the two end regions 15 comprising the front end region 15A and the rear end region 15B in which the distance D2 between the pair of wires 9 is larger than that in the middle region 14. The two end regions 15 (the front end region 15A and the rear end region 15B) are formed continuously from the two longitudinal end portions of the middle region 1. The two end regions 15 (the front end region 15A and the rear end region 15B) are formed to be gradually wider (i.e., the distance between the wires 9 gradually increases) from the portions continued from the middle region 14 toward the longitudinal outside such that the pair of wires 9 are arranged in parallel with the foregoing distance (D2) provided therebetween.

The conductive pattern 4 is disposed on the insulating base layer 3 in the rear end region 15B to secure the region where the base opening 11 is formed.

As shown in the left-side view of FIG. 2, the ground connection portion 7 integrally and continuously includes a lower part 12 formed to fill in the base opening 11 of the insulating base layer 3 described above and an upper part 13 formed to protrude upward in the thickness direction and extend out longitudinally and widthwise in both directions from the upper end of the lower part 12 in such a manner as to cover the surface of the insulating base layer 3 around the base opening 11.

The lower surface of the lower part 12 of the ground connection portion 7 is in contact with the metal supporting board 2.

The width of the lower part 12 of the ground connection portion 7 is in the range of, e.g., 40 to 2000 μm, or preferably 60 to 500 μm. The width of the upper part 13 of the ground connection portion 7 is in the range of, e.g., 70 to 2060 μm, or preferably 90 to 560 μm. The respective lengths of the lower part 12 and the upper part 13 of the ground connection portion 7 are selected appropriately depending on the purpose, application and design of a product.

As necessary, the suspension board with circuit 1 includes a metal thin film, though not shown, to be interposed between the semiconductive layer 5 and each of the conductive pattern 4 and the ground connection portion 7 to cover the conductive pattern 4 and the ground connection portion 7 depending the purpose and application.

The metal thin film, which is not shown, is formed as necessary on the surfaces of the conductive pattern 4 and the upper part 13 of the ground connection portion 7, i.e., on the upper and side surfaces of the wires 9 of the conductive pattern 4 and the upper and side surfaces of the upper part 13 of the ground connection portion 7.

As shown in FIGS. 1 and 2, the semiconductive layer 5 includes a one side semiconductive layer 5A located on one side and the other side semiconductive layer 5B located on the other side. Each of the semiconductive layer 5 is formed in a generally rectangular shape when viewed in plan view to cover each of the base opening 11. The one side semiconductive layer 5A and the other side semiconductive layer 5B is hereinafter simply described as the semiconductive layer 5 when distinction therebetween is not particularly needed.

As shown in FIG. 2, the semiconductive layer 5 is formed on the insulating base layer 3 covered with a first insulating cover layer 6A (described later) indicated by the imaginary line. That is, the semiconductive layer 5 is formed to be interposed between the insulating cover layer 6 (the first insulating cover layer 6A) and each of the insulating base layer 3, the conductive pattern 4, and the ground connection portion 7.

As a result, the semiconductive layer 5 has the lower side in the thickness direction in contact with the conductive pattern 4, the ground connection portion 7, and the insulating base layer 3 and has the upper side in the thickness direction in contact with the insulating cover layer 6 (first insulating cover layer 6A).

The one side semiconductive layer 5A and the other side semiconductive layer 5B, each as the semiconductive layer 5, are provided independently of each other. That is, the one side semiconductive layer 5A continuously covers the one side ground connection portion 7A and the one pair of wires 9a and 9b, thereby electrically connecting the wires 9a and 9b to the one side ground connection portion 7A via the one side semiconductive layer 5A.

The one side semiconductive layer 5A is in contact with the upper part 13 of the one side ground connection portion 7A on one widthwise outside (left-hand side) of a region SA where the one pair of wires 9a and 9b are opposed to be electrically connected to the metal supporting board 2 via the one side ground connection portion 7A.

As a result, the pair of wires 9a and 9b are electrically connected to the metal supporting board 2 via the one side semiconductive layer 5A and the one side ground connection portion 7A.

The other side semiconductive layer 5B continuously covers the other side ground connection portion 7B and the other pair of wires 9c and 9d, thereby electrically connecting the wires 9c and 9d to the other side ground connection portion 7B via the other side semiconductive layer 5B.

The other side semiconductive layer 5B is in contact with the upper part 13 of the other side ground connection portion 7B on the other side widthwise outside (right-hand side) of a region SB where the other pair of wires 9c and 9d are opposed to be electrically connected to the metal supporting board 2 via the other side ground connection portion 7B.

As a result, the pair of wires 9c and 9d are electrically connected to the metal supporting board 2 via the other side semiconductive layer 5B and the other side ground connection portion 7B.

As shown in FIG. 1, each of the one side semiconductive layer 5A and the other side semiconductive layer 5B is formed in a generally rectangular shape along the longitudinal direction such that the wire 9b in the one pair and the wire 9c in the other pair are widthwise spaced apart to expose the insulating base layer 3 located therebetween along the longitudinal direction. As a result, the one side semiconductive layer 5A and the other side semiconductive layer 5B are electrically insulated from each other.

As shown in FIG. 2, the insulating cover layer 6 is formed on the semiconductive layer 5. More specifically, in the rear end region 15B, the insulating cover layer 6 is formed on the insulating base layer 3 exposed from the semiconductive layer 5 to cover the semiconductive layer 5 and expose the peripheral end portion of the insulating base layer 3. In the front end region 15A and the middle region 14, the insulating cover layer 6 is formed continuously on the insulating base layer 3 exposed from the conductive pattern 4 to cover the conductive pattern 4 and cover the peripheral end portion of the insulating base layer 3 along the widthwise direction.

The insulating cover layer 6 has an opening, though not shown, in the portion corresponding to the terminal portion 8 of the conductive pattern 4 to expose the terminal portion 8.

The length and width of the insulating cover layer 6 are selected appropriately to provide the shape described above depending on the purpose and application.

The insulating cover layer 6 is formed of the first insulating cover layer 6A and a second insulating cover layer 6B when the first insulating cover layer 6A is used as an etching resist in the step (see FIG. 4(f)) of producing the suspension board with circuit 1 described later.

FIGS. 3 and 4 are cross-sectional views showing the steps of producing the suspension board with circuit shown in FIG. 2. FIGS. 3 and 4 include a left-side view corresponding to the cross-sectional view of the rear end region along the line A-A of FIG. 1 and a right-side view corresponding to the cross-sectional view of the middle region along the line B-B of FIG. 1, respectively.

Next, a description is given to a method for producing the suspension board with circuit 1 with reference to FIGS. 3 and 4.

First, as shown in FIG. 3(a), the metal supporting board 2 is prepared in the method.

For the metal supporting board 2, a foil of a metal such as, e.g., stainless steel, a 42-alloy, aluminum, copper, a copper-beryllium alloy, or phosphor bronze is used, or preferably a stainless steel foil is used. The thickness of the metal supporting board 2 is in the range of, e.g., 10 to 51 µm, or preferably 15 to 30 µm.

Then, as shown in FIG. 3(b), the insulating base layer 3 is formed on the metal supporting board 2 to correspond to the portion where the conductive pattern 4 is formed and have the base opening 11.

The insulating base layer 3 is made of a resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. In terms of heat resistance, the insulating base layer 3 is preferably made of the polyimide resin.

The method for forming the insulating base layer 3 in the foregoing pattern is not particularly limited and a known method is used. For example, a varnish of a photosensitive resin (photosensitive polyamic acid resin) is coated on a surface of the metal supporting board 2 and the coated varnish is dried to form a base coating. Then, the base coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating base layer 3 thus formed is in the range of, e.g., 1 to 35 µm, or preferably 8 to 15 µm.

Next, as shown in FIG. 3(c), the conductive pattern 4 is formed on the insulating base layer 3 as the foregoing wired circuit pattern, while the ground connection portion 7 is formed simultaneously on the metal supporting board 2 exposed from the base opening 11 of the insulating base layer 3 to fill the lower part 12 in the base opening 11 of the insulating base layer 3 and to have the upper part 13 covering the periphery of the base opening 11 in the insulating base layer 3.

The conductive pattern 4 and the ground connection portion 7 are made of a same conductive material such as, e.g., copper, nickel, gold, a solder, or an alloy thereof, although preferably made of copper. The conductive pattern 4 and the ground connection portion 7 are formed in the foregoing pattern on the upper surfaces of the insulating base layer 3 and the metal supporting board 2 (including the portion of the insulating base layer 3 exposed from the base opening 11) by a known patterning method such as, e.g., an additive method or a subtractive method. Preferably, the conductive pattern 4 and the ground connection portion 7 are formed by the additive method.

In the additive method, a conductive thin film (seed film) is formed first on the surfaces of the insulating base layer 3 and the metal supporting board 2. To form the conductive thin film, a chromium thin film and a copper thin film are successively laminated by sputtering, or preferably by chromium sputtering and copper sputtering.

Then, a plating resist is formed in a pattern reverse to the pattern of the conductive pattern 4 and the ground connection portion 7 on the upper surface of the conductive thin film.

Then, the conductive pattern 4 and the ground connection portion 7 are simultaneously formed on the upper surface of the conductive thin film exposed from the plating resist by electrolytic plating. Thereafter, the plating resist and the portion of the conductive thin film on which the plating resist is laminated are removed.

The thickness of the conductive pattern 4 thus formed is in the range of, e.g., 3 to 20 μm, or preferably 5 to 20 μm. The thickness of the upper part 13 of the ground connection portion 7 is in the range of 3 to 20 μm, or preferably 5 to 20 μm. The thickness of the lower part 12 of the ground connection portion 7 is the same as the thickness of the insulating base layer 3.

Next, a metal thin film, though not shown, is formed as necessary on the surfaces of the conductive pattern 4 and on the surfaces of the ground connection portion 7.

The metal thin film is made of a metal such as, e.g., nickel, gold, tin, chromium, titanium, zirconium, or an alloy thereof, although preferably, made of nickel.

The metal thin film is formed on, e.g., the conductive pattern 4 and the surfaces of the ground connection portion 7 by, e.g., an electrolytic or electroless plating method, a sputtering method using the metal listed above as a target, or the like. Preferably, the metal thin film made of a nickel thin film is formed by electroless nickel plating.

In electroless plating, the metal thin film is formed by, e.g., dipping the suspension board with circuit 1 in a process of the production shown in FIG. 3(c) in a solution of the metal listed above.

The thickness of the metal thin film formed as necessary is in the range of, e.g., 0.01 to 0.5 μm, or preferably 0.05 to 0.3 μm.

Next, as shown in FIG. 3(d), the semiconductive layer 5 is formed continuously on the surface of the conductive pattern 4 (or on the surface of the metal thin film when the conductive pattern 4 is covered with the metal thin film), on the surface of the upper part 13 of the ground connection portion 7 (or on the surface of the metal thin film when the upper part 13 of the ground connection portion 7 is covered with the metal thin film), on the surface of the insulating base layer 3 exposed from the conductive pattern 4 and the upper part 13 of the ground connection portion 7, and on the surface of the metal supporting board 2 exposed from the insulating base layer 3.

As a semiconductive material forming the semiconductive layer 5, a metal or a resin is used.

For example, a metal oxide or the like is used as the metal. Examples of the metal oxide include chromium oxide, nickel oxide, copper oxide, titanium oxide, zirconium oxide, indium oxide, aluminum oxide, and zinc oxide. Preferably, chromium oxide is used.

The method for forming the semiconductive layer 5 made of a metal oxide is not particularly limited. For example, the method such as a method of oxidizing a metal using a metal as a target after sputtering by heating as necessary, a method of reactive sputtering, or a method of sputtering using a metal oxide as a target is used.

In the method of oxidizing a metal using a metal as a target after sputtering by heating as necessary, the semiconductive layer 5 made of a metal oxide is formed by, e.g., a method of sputtering a metal such as chromium as a target, while introducing an inert gas such as argon, and then oxidizing the metal in an atmosphere at a temperature of 50 to 400° C. for 1 minute to 12 hours using a heating furnace or the like as necessary.

In the method of reactive sputtering, the semiconductive layer 5 made of a metal oxide is formed by, e.g., sputtering a metal such as chromium as a target in a sputtering apparatus, while introducing a reactive gas containing oxygen.

In the method of sputtering a metal oxide as a target, the semiconductive layer 5 made of a metal oxide is formed by, e.g., sputtering a metal oxide such as chromium oxide as a target in a sputtering apparatus, while introducing an inert gas such as argon.

Such a semiconductive layer 5 can be formed in accordance with the description of Japanese Unexamined Patent Publication No. 2004-335700.

As the resin, there can be used, e.g., a semiconductive resin composition or the like in which conductive particles are dispersed.

The semiconductive resin composition contains, e.g., an imide resin or an imide resin precursor, conductive particles, and a solvent.

As the imide resin, a known imide resin can be used. For example, polyimide, polyether imide, polyamide imide, or the like is used.

As the imide resin precursor, there can be used an imide resin precursor described in, e.g., Japanese Unexamined Patent Publication No. 2004-35825. For example, a polyamic acid resin is used.

As the conductive particles, there can be used, e.g., conductive polymer particles, carbon particles, metal particles, metal oxide particles, or the like.

As the conductive polymer particles, there can be used, e.g., particles of polyaniline, polypyrrole, polythiophene, or the like or particles of a derivative thereof. Preferably, particles of polyaniline are used. To the conductive polymer particles, conductivity is imparted by doping with a dopant.

As the dopant, there can be used, e.g., a p-toluenesulfonic acid, a dodecylbenzenesulfonic acid, an alkylnaphthalenesulfonic acid, a polystyrenesulfonic acid, a p-toluenesulfonic acid novolac resin, a p-phenolsulfonic acid novolac resin, a β-naphthalenesulfonic acid formalin condensate, or the like.

The doping may be performed by either preliminarily mixing the dopant in a solvent in which the conductive polymer particles are dispersed (dissolved) or after forming the semiconductive layer 5 and then dipping the suspension board with circuit 1 formed with the semiconductive layer 5 in a process of the production in the solution of the dopant.

As the carbon particles, there are used, e.g., particles of a carbon black or a carbon nanofiber.

As the metal particles, there are used, e.g., particles of chromium, nickel, copper, titanium, zirconium, indium, aluminum, zinc, or the like.

As the particles of a metal oxide, there are used particles of, e.g., chromium oxide, nickel oxide, copper oxide, titanium oxide, zirconium oxide, indium oxide, aluminum oxide, zinc oxide, or the like, or particles of a composite oxide thereof, more specifically particles of a composite oxide of indium oxide and tin oxide (ITO particles), particles of a composite oxide of tin oxide and phosphorus oxide (PTO particles), or the like.

The conductive particles can be used alone or in a combination of two or more thereof. Preferably, the ITO particles are used.

The conductive particles have an average particle diameter in the range of, e.g., 10 nm to 1 μm, preferably 10 nm to 400 nm, or more preferably 10 nm to 100 nm. When the conductive particles are made of a carbon nanofiber, the diameters thereof are in the range of, e.g., 100 to 200 nm and the lengths thereof are in the range of, e.g., 5 to 20 μm. When the average particle diameter is under the range shown above, the adjustment of the average particle diameter may be difficult. When the average particle diameter is over the range shown above, it may result in unsuitableness for coating.

The solvent is not particularly limited as long as the imide resin or the imide resin precursor and the conductive particles can be dispersed (dissolved) therein. For example, an aprotic polar solvent such as N-methyl-2-pyrrolidone (NMP), N,N-dimethylacetoamide, N,N-dimethylformamide, or dimethylsulfoxide is used. The solvents may be used alone or in a combination of two or more thereof.

The semiconductive resin composition can be prepared by mixing the imide resin or the imide resin precursor, the conductive particles, and the solvent, each described above.

The mixing ratio of the conductive particles is, e.g., 1 to 300 parts by weight, or preferably 5 to 100 parts by weight of the conductive particles to 100 parts by weight of the imide resin or the imide resin precursor. When the mixing ratio of the conductive particles is lower than the range shown above, the conductivity may be insufficient. When the mixing ratio of the conductive particles is higher than the range shown above, the excellent film properties of the imide resin or the imide resin precursor may be impaired.

The solvent is mixed such that the ratio of the total amount of the imide resin or the imide resin precursor and the conductive particles to the amount of the semiconductive resin composition is, e.g., 1 to 40 wt % (in solids concentration), or preferably 5 to 30 wt % (in solids concentration). When the solids concentration is either higher or lower than the range shown above, it may be difficult to a target film thickness.

The semiconductive resin composition prepared above is uniformly coated on the surface of the conductive pattern 4, on the surface of the upper part 13 of the ground connection portion 7, on the surface of the insulating base layer 3 exposed from the conductive pattern 4 and the upper part 13 of the ground connection portion 7, and on the surface of the metal supporting board 2 exposed from the insulating base layer 3 by a known coating method such as a roll coating method, a gravure coating method, a spin coating method, or a bar coating method. Thereafter, the coating is dried by heating at a temperature of, e.g., 60 to 250° C., or preferably 80 to 200° C. for, e.g., 1 to 30 minutes, or preferably 3 to 15 minutes.

When the semiconductive resin composition contains the imide resin precursor after drying, the imide resin precursor is cured (imidized) by, e.g., heating at a temperature of not less than 250° C. under a reduced pressure.

In this manner, the semiconductive layer 5 can be formed continuously on the surface of the conductive pattern 4, on the surface of the upper part 13 of the ground connection portion 7, on the surface of the insulating base layer 3 exposed from the conductive pattern 4 and the upper part 13 of the ground connection portion 7, and on the surface of the metal supporting board 2 exposed from the insulating base layer 3.

The thickness of the semiconductive layer 5 thus formed is in the range of, e.g., not more than 40 μm, or preferably 3 to 20 nm.

The surface resistance value of the semiconductive layer 5 is set to a value in the range of, e.g., $10^5$ to $10^{13}$ Ω/□, preferably $10^5$ to $10^{11}$ Ω/□, or more preferably $10^6$ to $10^9$ Ω/□. When the surface resistance value is under the foregoing range, there may be a case to cause malfunction of the magnetic head mounted thereon. When the surface resistance value of the semiconductive layer 5 is over the foregoing range, there may be a case to fail in prevention of electrostatic breakdown.

Then, as shown in FIG. 4(e), the first insulating cover layer 6A is formed in a pattern at the same position as the semiconductive layer 5 described above when viewed in plan view in the rear end region 15B.

The first insulating first cover layer 6A is made of the same resin as used to form the insulating base layer 3, preferably a photosensitive synthetic resin, or more preferably photosensitive polyimide.

The method for forming the first insulating cover layer 6A in the foregoing pattern is not particularly limited and a known method is used. For example, a varnish of a photosensitive resin (photosensitive polyamic acid resin) is coated on the surface of the semiconductive layer 5 and the coated varnish is dried to form a first cover coating. Then, the first cover coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the first insulating cover layer 6A thus formed is in the range of, e.g., 2 to 10 μm, or preferably 3 to 5 μm.

Then, as shown in FIG. 4(f), the semiconductive layer 5 exposed from the first insulating cover layer 6A is removed by etching.

As the etching, wet etching is performed using an aqueous alkaline solution such as an aqueous potassium hydroxide solution as an etchant and using the first insulating cover layer 6A as an etching resist by a dipping method or a spraying method.

In this manner, the semiconductive layer 5 can be formed in a pattern at the same position as the first insulating cover layer 6A when viewed in plan view.

The pair of wires 9 are electrically connected to the metal supporting board 2 via the semiconductive layer 5 and the ground connection portion 7. The resistance value between the pair of wires 9 and the metal supporting board 2 is in the range of, e.g., $1 \times 10^4$ to $1 \times 10^{12}$ Ω/□, or preferably $1 \times 10^5$ to $1 \times 10^{10}$ Ω/□, depending on the foregoing surface resistance value of the semiconductive layer 5 and the distance D2 between the pair of wires 9.

Then, as shown in FIG. 4(g), the second insulating cover layer 6B is formed on the insulating base layer 3 to cover the first insulating cover layer 6A in the rear end region 15B and cover the conductive pattern 4 in the front end region 15A and the middle region 14, thereby forming the insulating cover layer 6 in the foregoing pattern.

The second insulating first cover layer 6B is made of the same resin as used to form the first cover layer 6A, preferably a photosensitive synthetic resin, or more preferably photosensitive polyimide.

The method for forming the second insulating cover layer 6B in the foregoing pattern is not particularly limited and a known method is used. For example, a varnish of a photosensitive resin (photosensitive polyamic acid resin) is coated on the respective surfaces of the first insulating cover layer 6A, the insulating base layer 3, and the metal supporting board 2 and the coated varnish is dried to form a second cover coating. Then, the second cover coating is exposed to light via a photomask, heated as necessary, and developed to form the foregoing pattern (in which the magnetic-head-side connection terminal portions 8A and the external connection terminal portions 8B are opened). Thereafter, the pattern is cured (imidized) by, e.g., heating at a temperature of not less than 250° C. under a reduced pressure.

The thickness of the second insulating cover layer 6B thus formed is in the range of, e.g., 1 to 40 μm, or preferably 1 to 7 μm.

The total thickness of the first insulating cover layer 6A and the second insulating cover layer 6B at the portion of the rear end region 15B where the second insulating cover layer 6B is laminated on the first insulating cover layer 6A is in the range of, e.g., 3 to 20 μm, or preferably 5 to 15 μm.

By thus forming the second insulating cover layer 6B in the foregoing pattern on the insulating base layer 3, the insulating cover layer 6 comprising the first insulating cover layer 6A and the second insulating cover layer 6B is formed.

Thereafter, the metal supporting board 2 is cut out by chemical etching to form the gimbal 10 and then trimmed as shown in FIG. 1, whereby the suspension board with circuit 1 is obtained.

The suspension board with circuit 1 includes the semiconductive layer 5 electrically connected to the metal supporting board 2 and the conductive pattern 4. Consequently, the conductive pattern 4 is electrically connected to the metal supporting board 2 via the semiconductive layer 5. This allows efficient removal of the electrostatic charging of the conductive pattern 4.

In addition, the semiconductive layer 5 is provided only in the rear end region 15B having the large distance D2a between the one pair of wires 9a and 9b and the large distance D2b between the other pair of wires 9c and 9d. Therefore, even when the conductive material forming the conductive pattern 4 migrates between the one pair of wires 9a and 9b and between the other pair of wires 9c and 9d along the semiconductive layer 5, the short circuit of the conductive pattern 4 is delayed since the distance D2 is larger than the distance D1 in the middle region 14. As a result, it is possible to prevent an early short circuit of the conductive pattern 4.

In particular, in the rear end region 15B of the conductive pattern 4, the distance D2 between the wires 9 (the distance D2a between the one pair of wires 9a and 9b and the distance D2b between the other pair of wires 9c and 9d) is not less than 20 μm. Therefore, even when the conductive material forming the conductive pattern 4 migrates along each of the semiconductive layers 5 (the one side semiconductive layer 5A and the other side semiconductive layer 5B), the short circuit of the conductive pattern 4 can be further delayed and the early short circuit of the conductive pattern 4 can be more effectively prevented.

Figure 12:
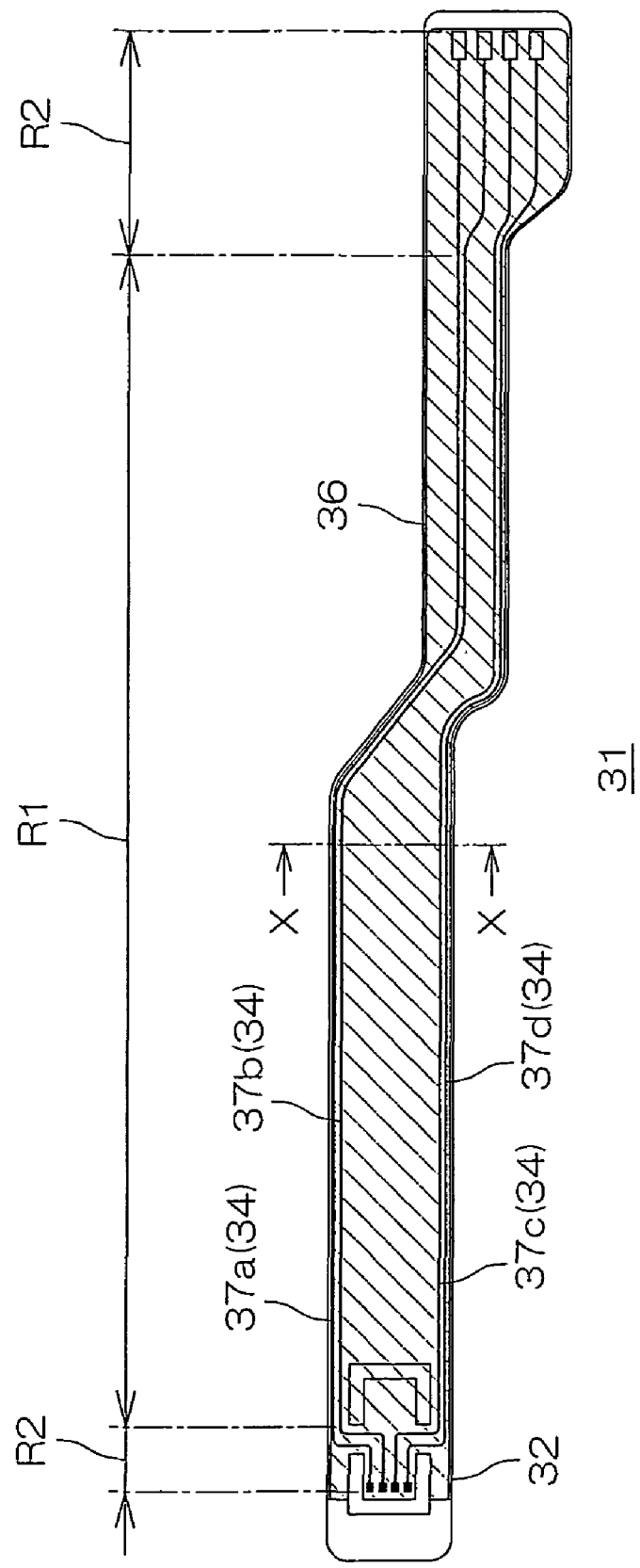
FIG. 12 is a schematic plan view showing a suspension board with circuit (in which a semiconductive layer is disposed continuously in a front end region, a rear end region, and a middle region)
Figure 13:
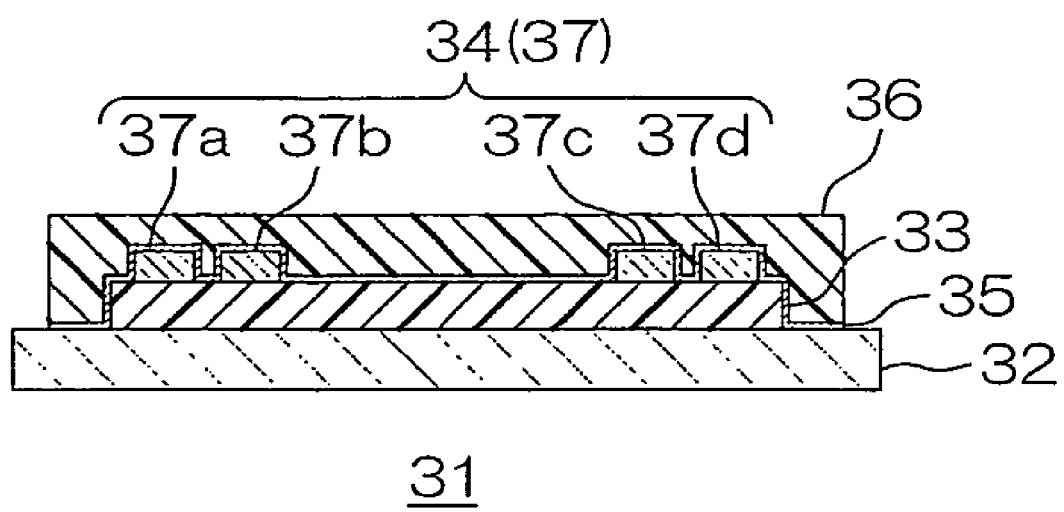
FIG. 13 is a cross-sectional view in a widthwise direction of the suspension board with circuit shown in FIG. 12, which is a cross-sectional view of the rear end region along the line X-X.

Normally, the suspension board with circuit 1 has a product life for use having the magnetic head mounted thereon. However, in the suspension board with circuit 31 shown in FIGS. 12 and 13, a short circuit may occur in the conductive pattern 34 before the product reaches the product life time due to the migration of the conductive material of the conductive pattern 34 between the pair of wires 37 along the semiconductive layer 35. By contrast, in the suspension board with circuit 1, the semiconductive layer 5 is not formed in the middle region 14, but is formed only in the rear end region 15B. Consequently, the short circuit of the conductive pattern 4 is delayed as described above and, when the delayed short circuit is within the product life span, the occurrence of a short circuit in the conductive pattern 4 can be effectively prevented.

As a result, it is possible to reliably prevent the electrostatic breakdown of the mounted magnetic head and also improve the connection reliability of the suspension board with circuit 1 over a long period.

In the description given above, the semiconductive layer 5 is formed in the rear end region 15B. However, the semiconductive layer 5 may also be formed in the front end region 15A.

In the description given above, the individual semiconductive layers 5 (the one side semiconductive layer 5A and the other side semiconductive layer 5B) are formed independently of each other. Instead, a single semiconductive layer 5 may also be formed to continuously cover the four wires 9a, 9b, 9c, and 9d and the two ground connection portions 7A and 7B, as shown in FIG. 11.

Figure 11:
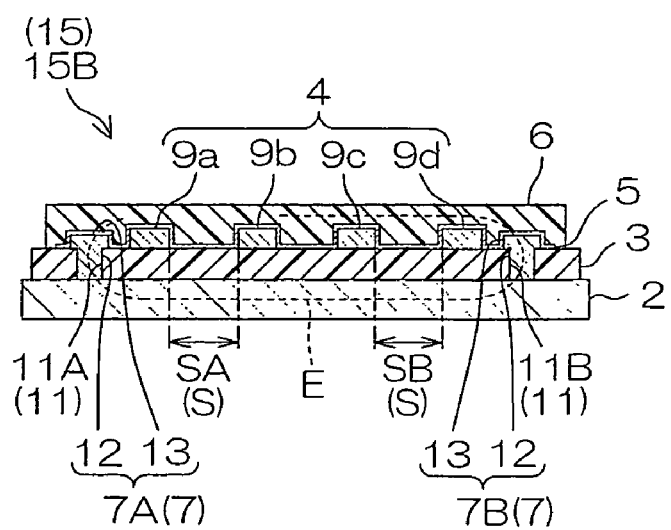
FIG. 11 is a cross-sectional view in a widthwise direction of a suspension board with circuit as a wired circuit board according to still another embodiment (in which a single semiconductive layer continuously covers four wires and two ground connection portions) of the present invention, corresponding to the cross-sectional view of the rear end region along the line A-A of FIG. 1.

When the single semiconductive layer 5 is formed to continuously cover the four wires 9a, 9b, 9c, and 9d and the two ground connection portions 7A and 7B as shown in FIG. 11, there may be a case where a loop-like electric field E indicated by the dotted line along the widthwise direction is formed around the one pair wires 9a and 9b due to the potential difference produced between the one pair of wires 9a and 9b. When such a loop-like electric field E is formed, there may be a case where the metal of the metal supporting board 2 migrates (ion migration) from the ground connection portion 7 to the insulating cover layer 6. The metal of the metal supporting board 2 may also migrate (ion migration) from the ground connection portion 7 to the insulating cover layer 6 due to the potential difference produced between the other pair of wires 9c and 9d, in the same manner as described above.

However, by forming the individual semiconductive layers 5 as the one side semiconductive layer 5A and the other side semiconductive layer 5B independently of each other as shown in FIG. 2, the one side semiconductive layer 5A is electrically connected to the metal supporting board 2 via the one side ground connection portion 7A on the one widthwise outside (left-hand side) of the region SA where the one pair of wires 9a and 9b are opposed, while it is electrically disconnected from the metal supporting board 2 on the other widthwise outside (right-hand side) of the region SA where the one pair of wires 9a and 9b are opposed. The other side semiconductive layer 5B is electrically connected to the metal supporting board 2 via the other side ground connection portion 7B on the other widthwise outside (right-hand side) of the region SB where the other pair of wires 9c and 9d are opposed, while it is electrically disconnected from the metal supporting board 2 on one widthwise outside (left-hand side) of the region SB where the other pair of wires 9c and 9d are opposed. Therefore, even when the one pair of wires 9a and 9b has the potential difference therebetween and the other pair of wires 9c and 9d has the potential difference therebetween, the formation of an electric field around the one pair of wires 9a and 9b and the formation of an electric field around the other pair of wires 9c and 9d, i.e., the formation of the loop-like electric field E as indicated by the dotted line in FIG. 11, can be reliably prevented.

As a result, this allows reliable prevention of the ion migration from the metal supporting board 2 to the insulating cover layer 6.

In the description given above, the one side ground connection portion 7A is formed only on the one widthwise outside (left-hand side in FIG. 2) of the region SA where the one pair of wires 9a and 9b are opposed. However, it is also possible to, e.g., form the one side ground connection portion 7A on the other widthwise outside (right-hand side) of the region SA where the one pair of wires 9a and 9b are opposed as indicated by the imaginary line in FIG. 2 and form the one side semiconductive layer 5A on the surface thereof.

The same shall apply to the other side ground connection portion 7B. It is also possible to, e.g., form the other side ground connection portion 7B on the one widthwise outside (left-hand side) of the region SB where the other pair of wires 9c and 9d are opposed as indicated by the imaginary line in FIG. 2 and form the other side semiconductive layer 5B on the surface thereof.

In the method for producing the suspension board with circuit 1 described above, the first insulating cover layer 6A is formed and the semiconductive layer 5 is formed using the first insulating cover layer 6A as the etching resist. However, it is also possible to form the semiconductive layer 5 using a known etching resist 17 as a resist without forming the first insulating cover layer 6A.

Figure 5:
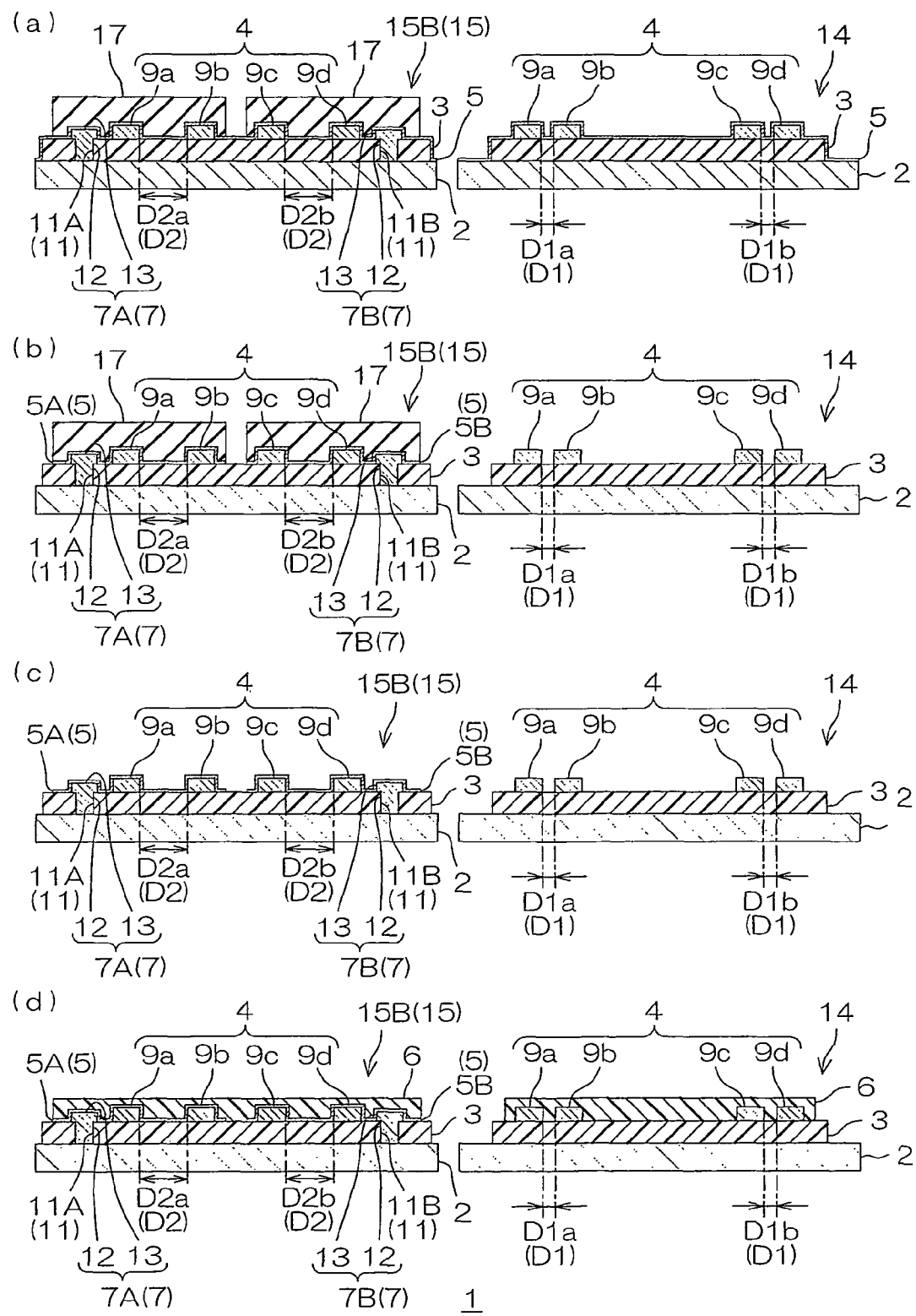
FIG. 5 is a cross-sectional view showing other steps as parts of the steps of producing the suspension board with circuit shown in FIGS. 3 and 4, (a) showing the step of forming an etching resist in a pattern on the semiconductive layer in the rear end region, (b) showing the step of removing the semiconductive layer exposed from the etching resist, (c) showing the step of removing the etching resist, and (d) showing the step of forming an insulating cover layer in a pattern on the semiconductive layer and the insulating base layer.

FIG. 5 is a cross-sectional view showing other steps as parts of the steps of producing the suspension board with circuit shown in FIGS. 3 and 4.

In this method, as shown in FIG. 3(*d*), the semiconductive layer 5 is formed continuously on the surface of the conductive pattern 4, on the surface of the ground connection portion 7, on the surface of the insulating base layer 3, and on the surface of the metal supporting board 2. Then, the etching resist 17 is formed in the foregoing pattern at the same position as the semiconductive layer 5 described above when viewed in plan view in the rear end region 15B, as shown in FIG. 5(*a*).

The etching resist 17 is formed in the foregoing pattern by a known method using, e.g., a dry film resist or the like.

Next, as shown in FIG. 5(*b*), the semiconductive layer 5 exposed from the etching resist 17 is removed by etching (wet etching).

Next, as shown in FIG. 5(*c*), the etching resist 17 is removed by, e.g., a known etching method such as wet etching or by stripping.

Next, as shown in FIG. 5(*d*), the insulating cover layer 6 is formed in the foregoing pattern in the same manner as described above.

For example, a varnish of a photosensitive resin (photosensitive polyamic acid resin) is coated on the respective surfaces of the semiconductive layer 5, the insulating base layer 3, and the metal supporting board 2 and the coated varnish is dried to form a cover coating. Then, the cover coating is exposed to light via a photomask, heated as necessary, and developed to form the foregoing pattern. Thereafter, the pattern is cured (imidized) by, e.g., heating at a temperature of not less than 250° C. under a reduced pressure.

The thickness of the insulating cover layer 6 thus formed is in the range of, e.g., 1 to 40 µm, or preferably 1 to 7 µm.

In this manner, the suspension board with circuit 1 can also be obtained by forming the semiconductive layer 5 using the known etching resist 17 as a resist without forming the first insulating cover layer 6A.

In accordance with the method, the insulating cover layer 6 having a uniform thickness can be formed without causing a difference between the total thickness of the first insulating cover layer 6A and the second insulating cover layer 6B at the foregoing portion of the rear end region 15B where the second insulating cover layer 6B is laminated on the first insulating cover layer 6A, and the thickness of the second insulating cover layer 6B. Consequently, the suspension board with circuit 1 having a reduced thickness can be obtained.

In the description given above, the semiconductive layer 5 of the suspension board with circuit 1 is electrically connected to the metal supporting board 2 via the ground connection portion 7 by forming the base opening 11 extending through the insulating base layer 3 in the thickness direction and forming the ground connection portion 7 on the metal supporting board 2 exposed from the base opening 11 without directly contacting the semiconductive layer 5 with the metal supporting board 2. However, it is also possible to, e.g., directly contact the semiconductive layer 5 of the suspension board with circuit 1 with the metal supporting board 2, as shown in FIG. 6.

Figure 6:
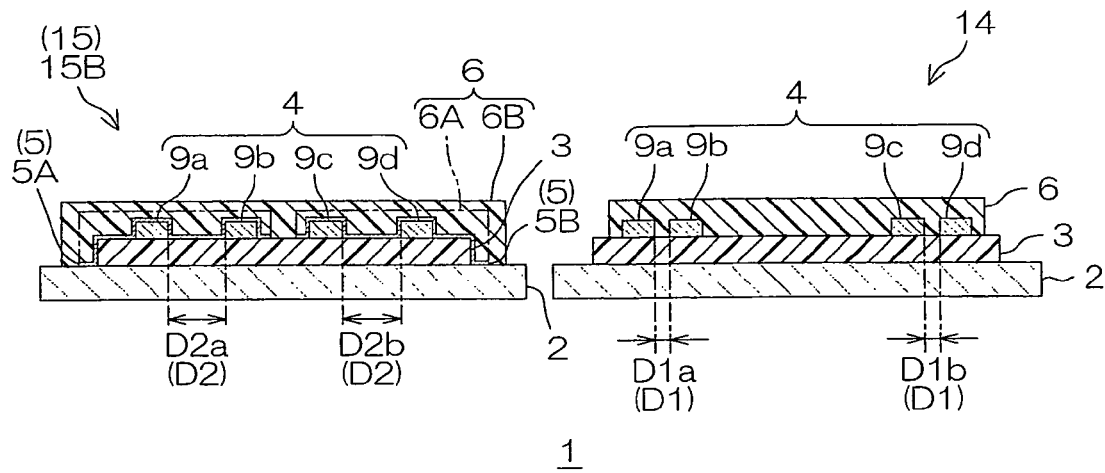
FIG. 6 is a cross-sectional view in a widthwise direction of a suspension board with circuit as a wired circuit board according to another embodiment (in which a semiconductive layer interposed between a conductive pattern and an insulating cover layer is in direct contact with a metal supporting board) of the present invention, including a left-side view corresponding to the cross-sectional view of a rear end region along the line A-A of FIG. 1 and a right-side view corresponding to the cross-sectional view of a middle region along the line B-B of FIG. 1.

In FIG. 6, the semiconductive layer 5 is formed on the insulating base layer 3 and the metal supporting board 2 each covered with the insulating cover layer 6 (the first insulating cover layer 6A) to cover the conductive pattern 4. That is, the semiconductive layer 5 is formed to be interposed between the insulating cover layer 6 (the first insulating cover layer 6A) and each of the metal supporting board 2, the insulating base layer 3, and the conductive pattern 4.

As a result, the semiconductive layer 5 is in contact with the metal supporting board 2, the insulating base layer 3, and the conductive pattern 4 at the lower side thereof in the thickness direction, while it is in contact with the insulating cover layer 6 (the first insulating cover layer 6A) at the upper side thereof in the thickness direction.

The length (longitudinal length) of the contact portion between the semiconductive layer 5 and the upper surface of the metal supporting board 2 is selected appropriately depending on the purpose and application. The width (widthwise length) of the contact portion is in the range of, e.g., 50 to 50000 µm, or preferably 100 to 20000 µm.

The suspension board with circuit 1 is obtained in accordance with, e.g., the following method, though not shown. First, the metal supporting board 2 is prepared. Then, the insulating base layer 3 is formed in a pattern on the metal supporting board 2 to correspond to the portion where the conductive pattern 4 is formed. Next, the conductive pattern 4 is formed in the foregoing wired circuit pattern on the insulating base layer 3. Next, the semiconductive layer 5 is formed continuously on the respective surfaces of the conductive pattern 4, the insulating base layer 3, and the metal supporting board 2. Next, the first insulating cover layer 6A is formed in a pattern at the same position as the semiconductive layer 5 described above when viewed in plan view in the rear end region 15B. Next, the semiconductive layer 5 exposed from the first insulating cover layer 6A is removed by etching. Next, the second insulating cover layer 6B is formed on the insulating base layer 3 to cover the first insulating cover layer 6A in the rear end region 15B and cover the conductive pattern 4 in the front end region 15A and the middle region 14, thereby forming the insulating cover layer 6 in the foregoing pattern.

In accordance with the method, it is unnecessary to provide the base opening 11 in the formation of the insulating base layer 3. In the formation of the conductive pattern 4, it is also unnecessary to provide the ground connection portion 7 together with the formation of the conductive pattern 4. This allows simple and easy production of the suspension board with circuit 1.

In the description given above, the semiconductive layer 5 is formed in the rear end region 15B of the two end regions 15 along the widthwise direction in FIG. 1. However, the semiconductive layer 5 can also be formed in either of the end regions 15 and the middle region 14 of the conductive pattern 4 as long as the semiconductive layer 5 can be formed to have a length D3 of not less than 20 µm between the pair of wires 9.

That is, in the suspension board with circuit 1 shown in FIG. 2, each of the semiconductive layers 5 (the one side semiconductive layer 5A and the other side semiconductive layer 5B) does not contact directly with the metal supporting board 2. This allows more reliable prevention of ion migration from the metal supporting board 2 to the insulating cover layer 6.

In the description given above, the semiconductive layer 5 is interposed between the conductive pattern 4 and the insulating cover layer 6, as shown in FIG. 6. However, it is also possible to interpose the semiconductive layer 5 between the conductive pattern 4 and the insulating base layer 3 as shown in, e.g., FIG. 7.

Figure 7:
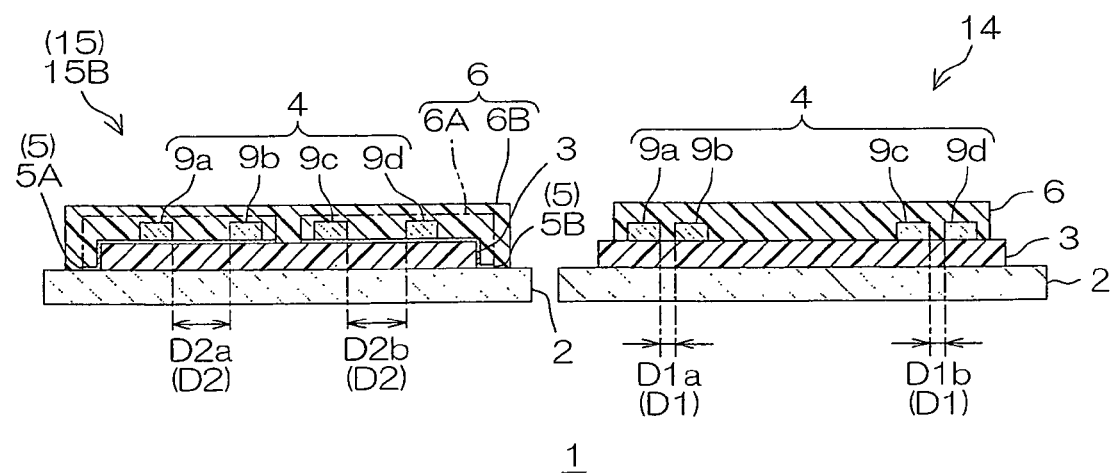
FIG. 7 is a cross-sectional view in a widthwise direction of a suspension board with circuit as a wired circuit board according to still another embodiment (in which a semiconductive layer interposed between a conductive pattern and an insulating base layer is in direct contact with a metal supporting board) of the present invention, including a left-side view corresponding to the cross-sectional view of a rear end region along the line A-A of FIG. 1 and a right-side view corresponding to the cross-sectional view of a middle region along the line B-B of FIG. 1.

In FIG. 7, the semiconductive layer 5 is formed to be interposed between each of the metal supporting board 2 and the insulating base layer 3 and each of the conductive pattern 4 and the insulating cover layer 6.

As a result, the semiconductive layer 5 is in contact with the metal supporting board 2 and the insulating base layer 3 at the lower side thereof in the thickness direction, while it is in contact with the conductive pattern 4 and the insulating cover layer 6 (the first insulating cover layer 6A) at the upper side thereof in the thickness direction.

The suspension board with circuit 1 is obtained in accordance with, e.g., the following method, though not shown. First, the metal supporting board 2 is prepared. Then, the insulating base layer 3 is formed in a pattern on the metal supporting board 2 to correspond to the portion where the conductive pattern 4 is formed. Next, the semiconductive layer 5 is formed continuously on the respective surfaces of the insulating base layer 3 and the metal supporting board 2. Next, the conductive pattern 4 is formed in the foregoing wired circuit pattern on the semiconductive layer 5. Next, the first insulating cover layer 6A is formed in a pattern at the same position as the semiconductive layer 5 described above when viewed in plan view in the rear end region 15B. Next, the semiconductive layer 5 exposed from the first insulating cover layer 6A is removed by etching. Next, the second insulating cover layer 6B is formed on the insulating base layer 3 to cover the first insulating cover layer 6A in the rear end region 15B and cover the conductive pattern 4 in the front end region 15A and the middle region 14, so that the insulating cover layer 6 is formed in the foregoing pattern.

The suspension board with circuit 1 is also obtained in accordance with, e.g., the following method other than the foregoing method, though not shown. First, the metal supporting board 2 is prepared. Then, the insulating base layer 3 is formed in a pattern on the metal supporting board 2 to correspond to the portion where the conductive pattern 4 is formed. Next, a conductive thin film (seed film) is formed on the respective surfaces of the insulating base layer 3 and the metal supporting board 2 by successively laminating a chromium thin film and a copper thin film by chromium sputtering and copper sputtering. Thereafter, the conductive pattern 4 is formed in the foregoing wired circuit pattern on the conductive thin film by an additive method. Then, the copper thin film exposed from the conductive pattern 4 is removed by etching such that the chromium thin film remains. Next, the chromium thin film exposed as a result of removing the copper thin film is subjected to a semi-conductivity imparting process involving oxidation based on heating, thereby forming the semiconductive layer 5 made of a chromium oxide layer. Next, the first insulating cover layer 6A is formed in a pattern at the same position as the semiconductive layer 5 described above when viewed in plan view in the rear end region 15B. Next, the semiconductive layer 5 exposed from the first insulating cover layer 6A is removed by etching. Next, the second insulating cover layer 6B is formed on the insulating base layer 3 to cover the first insulating cover layer 6A in the rear end region 15B and cover the conductive pattern 4 in the front end region 15A and the middle region 14, so that the insulating cover layer 6 is formed in the foregoing pattern.

In accordance with the method for producing the suspension board with circuit 1 in which the semiconductive layer 5 is formed by the foregoing semi-conductivity imparting process, the foregoing suspension board with circuit 1 shown in FIG. 7 can be produced easily and efficiently.

In the description given above, the semiconductive layer 5 is formed in the rear end region 15B of the both end region 15 along the widthwise direction in FIG. 1. However, the semiconductive layer 5 can also be formed in either of the end region 15 and the middle region 14 of the conductive pattern 4 as long as the semiconductive layer 5 can be formed to have a length D3 of not less than 20 µm between the pair of wires 9.

Figure 8:
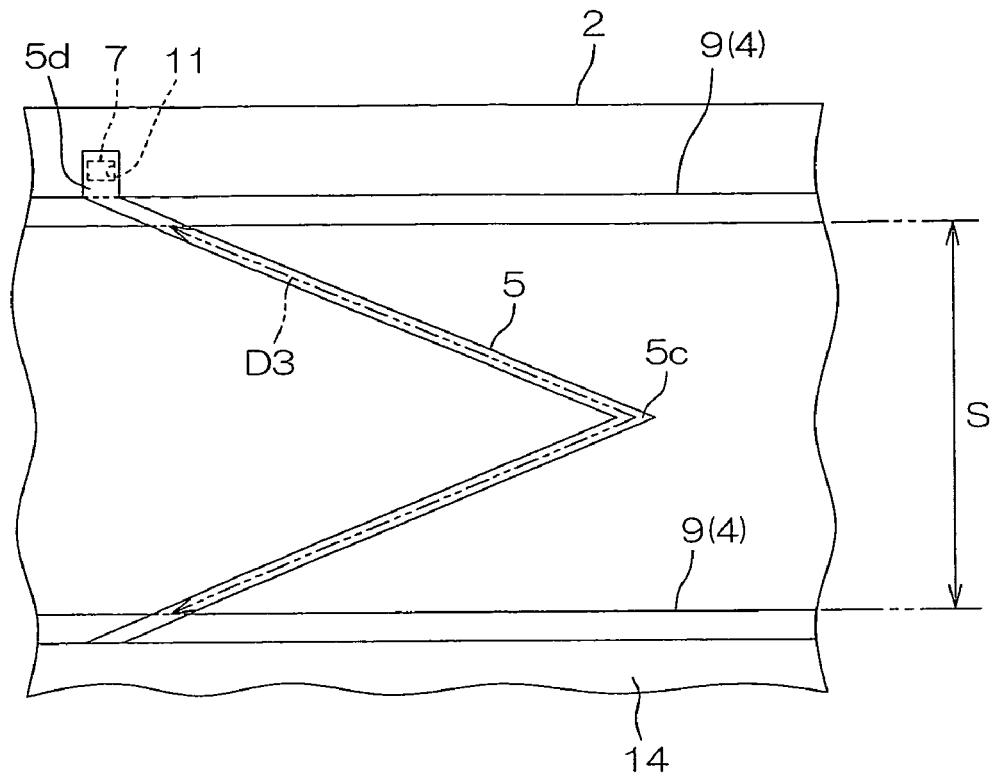
FIG. 8 is an enlarged plan view showing a semiconductive layer (disposed in a generally V-shape) between a pair of wires in a suspension board with circuit as a wired circuit board according to yet another embodiment of the present invention.
Figure 9:
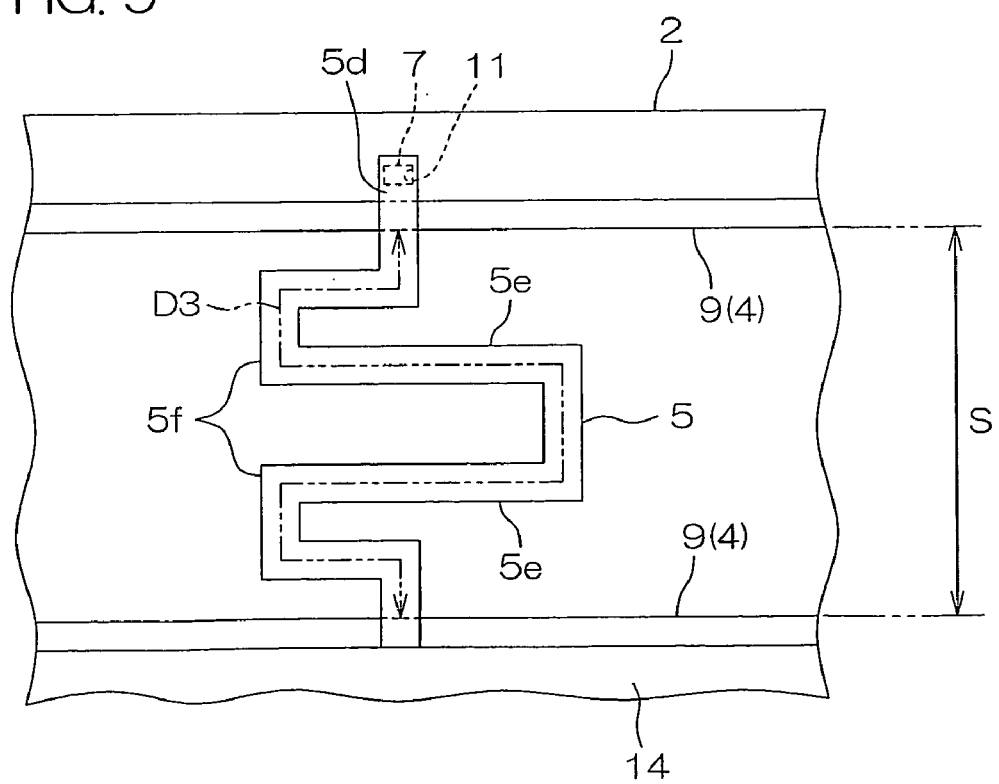
FIG. 9 is an enlarged plan view showing a semiconductive layer (disposed in a generally meandering shape) between a pair of wires in a suspension board with circuit as a wired circuit board according to still another embodiment of the present invention.
Figure 10:
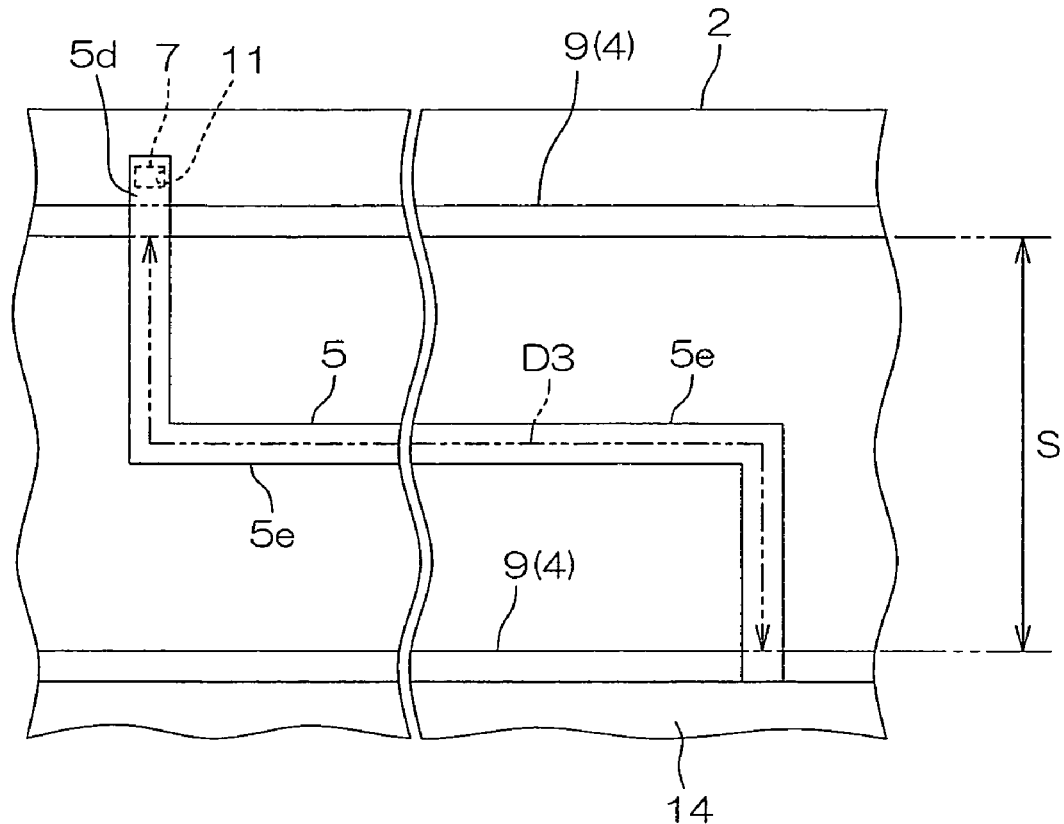
FIG. 10 is an enlarged plan view showing a semiconductive layer (disposed linearly along a longitudinal direction) between a pair of wires in a suspension board with circuit as a wired circuit board according to yet another embodiment of the present invention.

FIGS. 8 to 10 are enlarged plan views showing a semiconductive layer between a pair of wires in suspension boards with circuit as wired circuit boards according to other embodiments of the present invention. In the embodiment shown in FIG. 8, the semiconductive layer is disposed in a generally V-shape. In the embodiment shown in FIG. 9, the semiconductive layer is disposed in a generally meandering shape. In the embodiment shown in FIG. 10, the semiconductive layer is disposed linearly along the longitudinal direction. In FIGS. 8 to 10, the description of the same members as described above is omitted using the same reference numerals.

For example, in FIG. 8, the semiconductive layer 5 is formed in a generally V-shape between the individual wires 9 in the middle region 14 to have an apical portion 5c midway in the widthwise direction which protrudes longitudinally in one direction. The semiconductive layer 5 protrudes toward one side outside of the region where the pair of wires 9 are opposed. On the resulting protruding portion 5d thus formed, the ground connection portion 7 described above is formed so that the semiconductive layer 5 is in contact with the ground connection portion 7 at the protruding portion 5d in the same manner as described above.

For example, in FIG. 9, the semiconductive layer 5 is formed in a meandering shape between the individual wires 9 in the middle region 14 to have alternating linear portions 5e and bent portions 5f. On the protruding portion 5d of the semiconductive layer 5, the ground connection portion 7 is formed in the same manner as described above.

For example, in FIG. 10, the semiconductive layer 5 is formed continuously between the individual wires 9 in the middle region 14 to have a linear portion 5e midway in the widthwise direction extending long along each of the wires 9 and to have both end portions bent toward both outsides in the widthwise direction and connected to the respective wires 9. On the protruding portion 5d of the semiconductive layer 5, the ground connection portion 7 is formed in the same manner as described above.

In the foregoing suspension boards with circuits 1 shown in FIGS. 8 to 10, each of the semiconductive layers 5 formed in the shapes shown in the foregoing drawings (FIGS. 8 to 10) has the length D3 of not less than 20 µm between the pair of wires 9. Preferably, the length D3 is in the range of not less than 40 µm, more preferably not less than 50 µm, or normally not more than 500 µm.

Thus, the semiconductive layer 5 is formed to ensure the length D3 of not less than 20 µm between the pair of wires 9. Therefore, even when the conductive material forming the conductive pattern 4 migrates along the semiconductive layer 5, the short circuit of the conductive pattern 4 is delayed and an early short circuit of the conductive pattern 4 can be effectively prevented.

As a result, it is possible to reliably prevent the electrostatic breakdown of the magnetic head mounted and also effectively improve the connection reliability of the suspension board with circuit 1 over a long period.

In the description given above, the single ground connection portion 7 is provided on one widthwise side of the pair of wires 9. However, the number of the ground connection portions 7 is not limited thereto and can be selected appropriately depending on the purpose and application.

In the description given above, the ground connection portion 7 is formed in a rectangular shape when viewed in plan view. However, the shape of the ground connection portion 7 is not limited thereto. For example, the ground connection portion 7 can be formed in an appropriate shape such as a generally circular shape when viewed in plan view.

In the description given above, the conductive pattern 4 is formed of the four wires 9. However, the number of the wires 9 is not particularly limited. For example, the conductive pattern 4 can also be formed of six wires 9. The six wires are formed of the four wires 9 described above, a TFC (thermal fly-height control) wire to which a signal for controlling the minute gap between the magnetic head and the magnetic disk, and two wires (a pair of wires) composed of ground wires for the TFC wires.

In the description given above, the suspension board with circuit 1 is shown as an example of the wired circuit board according to the present invention. However, the wired circuit board according to the present invention is not limited thereto. The wired circuit board according to the present invention is widely applicable to other wired circuit board such as various flexible wired circuit boards in each of which a metal supporting board 2 is provided as a reinforcing layer.

EXAMPLES

The present invention is described more specifically by showing the example and the comparative example herein below. However, the present invention is by no means limited to the example and the comparative example.

Example 1

A metal supporting board made of a stainless steel foil having a thickness of 20 µm was prepared (see FIG. 3(a)).

Then, a varnish of a photosensitive polyamic acid resin was uniformly coated on a surface of the metal supporting board with a spin coater. Subsequently, the coated varnish was heated at 90° C. for 15 minutes to form a base coating. Thereafter, the base coating was exposed to light at 700 mJ/cm$^2$ via a photomask, heated at 190° C. for 10 minutes, developed with an alkaline developer, and cured at 385° C. under a reduced pressure of 1.33 Pa, thereby forming an insulating base layer made of photosensitive polyimide on the metal supporting board to correspond to the portion where a conductive pattern was formed and have base openings in correspondence to the rear end region of a conductive pattern subsequently formed (see FIG. 3(b)). The thickness of the insulating base layer was 10 µm. Each of the base openings had a rectangular shape when viewed in plan view, a width of 80 µm, and a length of 300 µm.

Then, a conductive pattern made of a copper foil and having a thickness of 10 µm was formed by an additive method on the upper surface of the insulating base layer to serve as a wired circuit pattern having a front end region, the rear end region, and a middle region, while ground connection portions made of copper were simultaneously formed on the metal supporting board exposed from the base openings to fill the lower parts in the base openings of the insulating base layer and to have the upper parts covering the peripheries of the base openings of the insulating base layer (see FIG. 3(c)).

The distance (distance at the portion where the semiconductive layer was to be formed) between a pair of wires in both end regions (the front end region and the rear end region) was 100 µm. The distance between the pair of wires in the middle region was 20 µm. Each of the ground connection portions had the upper part and the lower part each shaped in a rectangle when viewed in plan view. The lower part had a width of 80 µm and a length of 300 µm. The upper part had a width of 140 µm, a length of 360 µm, and a thickness of 10 µm.

Thereafter, a metal thin film composed of a nickel thin film having a thickness of 0.15 µm was formed on the surface of the conductive pattern and on the surface of the ground connection portion by electroless nickel plating.

Then, a sputtering coating composed of a chromium thin film was formed on the respective surfaces of the metal thin film formed on the surfaces of the conductive pattern and the ground connection portion, the insulating base layer, and the metal supporting board by sputtering chromium as a target.

The sputtering was performed under the following conditions by a method in accordance with the description of Japanese Unexamined Patent Publication No. 2004-335700.

Target: Cr
Ultimate Degree of Vacuum: $1.33 \times 10^{-3}$ Pa
Flow Rate of Introduced Gas (Ar): $2.0 \times 10^{-3}$ m$^3$/hour
Operating Pressure: 0.16 Pa
Temperature of Earth Electrode: 20° C.
Electric Power: DC 500 W
Sputtering Time: 3 Seconds
Thickness of Sputtering Coating: 100 nm Then, the surface of the sputtering coating composed of the chromium thin film was oxidized by heating in an atmosphere at 125° C. for 12 hours to form a semiconductive layer composed of a chromium oxide layer (see FIG. 3(d)). The thickness of the chromium oxide layer was 100 nm.

The formation of the semiconductive layer composed of the chromium oxide layer was confirmed by ESCA. As a result of measuring the surface resistance value of the semiconductive layer at a temperature of 25° C. and a humidity of 15% using a surface resistance measuring device (Hiresta-up MCP-HT450 available from Mitsubishi Chemical Corporation), it was $1 \times 10^7 \Omega / \square$.

Then, the varnish of the photosensitive polyamic acid resin mentioned above was uniformly coated on the surface of the semiconductive layer with a spin coater and heated at 90° C. for 10 minutes to form a first cover coating having a thickness of 4 µm. Then, the first cover coating was exposed to light at 700 mJ/cm$^2$ via a photomask, heated at 180° C. for 10 minutes, and developed with an alkaline developer to be patterned. Thereafter, the patterned first cover coating was cured at 385° C. under a reduced pressure of 1.33 Pa. In this manner, a first insulating cover layer made of the photosensitive polyimide was formed in the foregoing pattern on the semiconductive layer formed in the rear end region (see FIG. 4(e)). The first insulating cover layer had a rectangular shape when viewed in plan view, a width of 40 µm, a length of 50 µm, and a thickness of 4 µm.

Subsequently, the semiconductive layer exposed from the first insulating cover layer was removed by wet etching using the first insulating cover layer as an etching resist and an aqueous potassium hydroxide solution (see FIG. 4(f)). In this manner, the semiconductive layer was formed to have the same shape (rectangular shape) as the first insulating cover layer when viewed in plan view.

Then, a second insulating cover layer was formed on the insulating base layer to cover the first insulating cover layer in the rear end region and cover the conductive pattern in the front end region and the middle region, so that an insulating cover layer composed of the first insulating cover layer and the second insulating cover layer was formed in the foregoing pattern (see FIG. 4(g)). The thickness of the second insulating cover layer was 5 µm.

Thereafter, the metal supporting board was cut out by chemical etching to form a gimbal and then trimmed, whereby a suspension board with circuit was obtained (see FIG. 1). In the suspension board with circuit, the resistance value between the pair of wires and the metal supporting board was 1 to $10^8 \Omega/\square$.

Comparative Example 1

A suspension board with circuit was produced in the same manner as in Example 1 except that the first insulating cover layer was provided continuously on the front end region, the rear end region, and the middle region (see FIGS. 12 and 13) in the production of the suspension board with circuit of Example 1.

That is, the semiconductive layer was formed continuously between the insulating cover layer (the first insulating cover layer indicated by the imaginary line in FIG. 2) and each of the conductive pattern, the insulating base layer, and the metal supporting board in the both end regions and the middle region.

(Evaluation)

Endurance Test (Short Circuit in Conductive Pattern and Ion Migration of Stainless Steel of Metal Supporting Board)

To each of the suspension boards with circuits obtained in Example 1 and Comparative Example 1, a voltage of 6 V was applied for 1000 hours in an atmosphere at 85° C. and 85% RH.

As a result, the short circuit of the conductive pattern was not observed in the suspension board with circuit of Example 1 even when 1000 hours or more elapsed. By contrast, in the suspension board with circuit of Comparative Example 1, the short circuit of the conductive pattern was observed when 320 hours elapsed.

As a result of performing sectional SEM observation and element analysis with respect to the suspension board with circuits of Example 1 and Comparative Example 1 after a lapse of 1000 hours in the endurance test performed under the foregoing conditions, the result confirmed that ion migration of stainless steel of the metal supporting board to the insulating cover layer did not occur in Example 1. By contrast, in the suspension board with circuit according to Comparative Example 1, the result confirmed that ion migration of stainless steel of the metal supporting board to the insulating cover layer.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board for mounting a magnetic head, comprising:
    a metal supporting board;
    an insulating layer formed on the metal supporting board;
    one wire formed on the insulating layer and electrically connected to the magnetic head;
    another wire formed on the insulating layer, arranged in spaced-apart relation with the one wire and electrically connected to the magnetic head;
    one semiconductive layer formed so as to cover the one wire and electrically connected to the metal supporting board;
    another semiconductive layer formed so as to cover the other wire and electrically connected to the metal supporting board, wherein the one semiconductive layer and the other semiconductive layer are spaced apart therebetween,
    the wired circuit board further comprising an insulating cover layer as an external protective cover layer formed on the one semiconductive layer and the other semiconductive layer,
    a pair of wires of the one wire arranged in an opposing relation and having different potentials;
    a pair of wires of the other wire arranged in an opposing relation and having different potentials;
    the one semiconductive layer is electrically connected to the metal supporting board on one outer widthwise side adjacent to one widthwise side edge of the wired circuit board and outside a region where the pair of wires of the one wire are opposed; and
    the other semiconductive layer is electrically connected to the metal supporting board on an opposite outer widthwise side adjacent to an opposite widthwise side edge of the wired circuit board and outside a region where the pair of wires of the other wire are opposed.

2. The wired circuit board according to claim 1, wherein the one wire has the pair of wires arranged in spaced-apart relation from each other;
    the other wire has the pair of wires arranged in spaced-apart relation from each other; and the one semiconductive layer and the other semiconductive layer are each formed independently.

* * * * *

UNITED STATES PATENT AND TRADEMARK OFFICE
CERTIFICATE OF CORRECTION

Page 1 of 1

PATENT NO. : 8,247,700 B2
APPLICATION NO. : 12/382266
DATED : August 21, 2012
INVENTOR(S) : Jun Ishii et al.

It is certified that error appears in the above-identified patent and that said Letters Patent is hereby corrected as shown below:

Column 18, lines 45-52, the text "In the description given above, the semiconductive layer 5 is formed in the rear end region 15B of the two end regions 15 along the widthwise direction in FIG. 1. However, the semiconductive layer 5 can also be formed in either of the end regions 15 and the middle region 14 of the conductive pattern 4 as long as the semiconductive layer 5 can be formed to have a length D3 of not less than 20 μm between the pair of wires 9." should read, --In the suspension board with circuit 1 shown in FIG. 2, the ground connection portions 7 (the one side ground connection portion 7A and the other side ground connection portion 7B) are formed. As a result, the one pair of wires 9a and 9b are electrically connected to the metal supporting board 2 via the one side ground connection portion 7A and the other pair of wires 9c and 9d are electrically connected to the metal supporting board 2 via the other side ground connection portion 7B.--

Signed and Sealed this
Thirteenth Day of November, 2012

David J. Kappos
*Director of the United States Patent and Trademark Office*